United States Patent
Ozawa

(10) Patent No.: US 6,424,331 B1
(45) Date of Patent: Jul. 23, 2002

(54) DRIVING CIRCUIT FOR ELECTRO-OPTICAL DEVICE, DRIVING METHOD THEREFOR, DA CONVERTER, SIGNAL LINE DRIVING CIRCUIT, ELECTRO-OPTICAL PANEL, PROJECTION TYPE DISPLAY DEVICE, AND ELECTRONIC EQUIPMENT

(75) Inventor: Tokuro Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/581,038

(22) PCT Filed: Dec. 15, 1999

(86) PCT No.: PCT/JP99/05722

§ 371 (c)(1), (2), (4) Date: Jun. 8, 2000

(87) PCT Pub. No.: WO00/23977

PCT Pub. Date: Apr. 27, 2000

(30) Foreign Application Priority Data

Oct. 16, 1998 (JP) ............................................. 10-295657

(51) Int. Cl.[7] ................................................. G09G 3/36
(52) U.S. Cl. .......................... 345/98; 341/144; 341/150
(58) Field of Search .............................. 345/92, 87, 98, 345/99, 100; 341/144, 150, 172

(56) References Cited

U.S. PATENT DOCUMENTS 4,325,055 A  4/1982 Colardelle et al.
5,107,266 A * 4/1992 Kim ............................ 341/172
5,696,509 A  12/1997 Maejima
5,923,275 A * 7/1999 Kalb ............................ 341/150

FOREIGN PATENT DOCUMENTS

| EP | 0 821 490 A1 | 1/1998 |
|---|---|---|
| JP | A-55-60335 | 5/1980 |
| JP | A-61-242118 | 10/1986 |
| JP | A-63-179624 | 7/1988 |
| JP | A-7-72822 | 3/1995 |
| JP | A-9-46230 | 2/1997 |
| JP | A-9-326701 | 12/1997 |
| JP | A-11-296147 | 10/1999 |

* cited by examiner

Primary Examiner—Dennis-Doon Chow
(74) Attorney, Agent, or Firm—Oliff & Berridge, PLC

(57) ABSTRACT

First, when a switch portion is in an off-state, the first charging portion C1 charges parasitic capacitance CS. Second, a second charging portion C2 charges internal capacitance CD during the switch portion SW remains in the off-state. Third, the switch portion SW is turned on. Then, electric charges flow into the parasitic capacitance CS from the internal capacitance CD. Finally, the value of the voltage of the internal capacitance CD becomes equal to that of the voltage of the parasitic capacitance CS. Fourth, the switch portion SW is turned off. Then, the second charging portion C2 charges the internal capacitance CD again. Thence, the third step and the fourth step are repeated. Consequently, the voltage of the parasitic capacitance CS can be set at a desired value.

19 Claims, 27 Drawing Sheets

| D5,D4,D3 | REFERENCE VOLTAGE | RESET VOLTAGE |
|---|---|---|
| 0 0 0 | Va0=4.4V | Vr0=0V |
| 0 0 1 | Va1=3.1V | Vr1=1.18V |
| 0 1 0 | Va2=2.6V | Vr2=1.69V |
| 0 1 1 | Va3=2.3V | Vr3=1.91V |
| 1 0 0 | Va4=1.6V | Vr4=2.14V |
| 1 0 1 | Va5=1.3V | Vr5=2.47V |
| 1 1 0 | Va6=0.4V | Vr6=3.23V |
| 1 1 1 | Va7=1.5V | Vr7=+5.0V |

FIG. 22

DRIVING CIRCUIT FOR ELECTRO-OPTICAL DEVICE, DRIVING METHOD THEREFOR, DA CONVERTER, SIGNAL LINE DRIVING CIRCUIT, ELECTRO-OPTICAL PANEL, PROJECTION TYPE DISPLAY DEVICE, AND ELECTRONIC EQUIPMENT

BACKGROUND OF THE INVENTION

This invention relates to a driving circuit for an electro-optical device, a driving method therefor, a DA converter, a signal line driving circuit, an electro-optical panel, a projection display device, and electronic equipment.

DESCRIPTION OF RELATED ART

Generally, an image display portion of a liquid crystal display device is constituted by a device substrate, an opposing substrate, and a liquid crystal which fills the gap between these substrates. A plurality of scanning lines, a plurality of signal lines, and a plurality of transistors and a plurality of pixel electrodes provided correspondingly to intersections between the scanning lines and the signal lines, are formed on the device substrate. On the other hand, common electrodes are formed on the opposing substrate. Further, the plurality of transistors used therein are thin film transistors (hereunder referred to as TFTs).

Each of the TFTs has a gate, a source, and a drain, which are respectively connected to one of the scanning lines, one of the signal lines, and one of the pixel electrodes.

Usually, a method for driving this image display portion may consist of the steps of simultaneously turning on a plurality of TFTs connected to scanning lines by selecting the scanning lines with a predetermined timing, and then simultaneously applying voltages of signal lines to pixel electrodes. In this case, voltages corresponding to image data are supplied to the signal lines. The transmittance of a liquid crystal is controlled according to a voltage applied to between the pixel electrodes and common electrodes. This enables the display device to perform gray scale display according to values represented by image data.

Meanwhile, the relation between the voltage applied to a liquid crystal and the transmittance of the liquid crystal is not linear but non-linear. Thus, there is the necessity for performing a process of making an amount of a change in the transmittance of the liquid crystal caused corresponding to each gray scale level of the image data, uniform. In the present application, this process is referred to as a γ correction.

FIG. 28 is a block diagram illustrating a signal line driving circuit for driving one of the signal lines, and also illustrating peripheral circuits thereof. In this figure, the signal line driving circuit consists of a first latch circuit 921, a second latch circuit 922, and a DA converter 93. Further, a controller 6 and a γ correction circuit 91 are provided at the preceding stage of this signal line driving circuit.

The controller 6 generates 6-bit image data DA. The γ correction circuit 91 performs a γ correction on the image data DA to thereby produce 8-bit image data DB (Dγ1, Dγ2, ..., Dγ8). Incidentally, the γ correction circuit 91 is constituted by a RAM or a ROM, in which a table for performing a γ correction is stored. Data stored in this table is determined according to the input/output characteristics of the DA converter 93 and the transmittance-applied-voltage characteristics of the liquid crystal.

The DA converter 93 is a capacitance-divided type DA converter, which has switch and capacitive elements. The DA converter 93 has 8 capacitive devices 941 to 948. Let C denote the capacitive value of the capacitive device 941. The capacitive values of the capacitive devices 942, 943, ..., 948 are selected as 2C, 4C, ..., 128C, respectively.

Further, a signal line 99 has a signal line parasitic capacitor or capacitance 940. In FIG. 28, the value of the parasitic capacitance is designated by reference character Cs. The voltage Vcom at the other terminal of the signal line capacitor 940 is applied to a common electrode placed in the opposing substrate.

Two reference voltages Va and Vb are supplied to the DA converter 93. One of terminals of each of the capacitive devices 941 to 948 is connected to a supply terminal Ta through which the reference voltage Va is supplied. On the other hand, the other terminal of each of the capacitive devices 941 to 948 is connected to the supply terminal Ta through a corresponding one of the reset switches 951 to 958. When each of the switches 951 to 958 is turned on, both terminals of each of the capacitive devices 941 to 948 is short-circuited. Thus, charges charged in each of these capacitive devices are discharged. Further, a reset switch 910 is connected to a point between a supply terminal Tb, through which the reference voltage Vb is supplied, and the signal line 99. When this switch 910 is turned on, the electric potential of the signal line 99 is reset to the voltage Vb.

Additionally, switches 961 to 968 adapted to be turned on or off according to the values indicated by the image data Dγ1 to Dγ8 are provided between the signal line 99 and each of the capacitive devices 941 to 948. When the switches 961 to 968 are selectively turned on, the capacitive devices connected to the turned-on switches are connected in parallel with one another. Consequently, a voltage corresponding to the image data DB is applied to the signal line 99.

FIG. 29(A) is a graph illustrating the relation between the decimal value of the image data DA and the output voltage Vc of a DA converter 93. FIG. 29(B) is a graph illustrating the relation between the transmittance SLP of a liquid crystal and the voltage VLP to be applied to a pixel electrode through the signal line.

A brief description is given of the operating principle of the driving circuit with reference to FIGS. 29(A) and 29(B). First, when the 6-bit image data DA is inputted from the controller 6 to the γ correction circuit 91, this correction circuit 91 converts the image data DA to the 8-bit image data DB. Incidentally, the aforementioned table is created as follows. First, 64 pieces of the 8-bit data, from which gray scale levels are set according to the transmittance characteristic of the liquid crystal pixel in such a manner as to respectively correspond to equal intervals of a predetermined change in the transmittance of the liquid crystal, are preliminarily selected from 256 pieces of the 8-bit data. Then, the selected 64 pieces of the 8-bit data are stored in the table as the image data DB by being made to correspond to the 6-bit image data DA, respectively.

Thus, when the 6-bit image data DA is inputted to the γ correction circuit 91, this γ correction circuit 91 reads data from the table, which corresponds to the value represented by the inputted image data DA and outputs the read data as the image data DB. That is, the image data DB is represented by using 8 bits so that amounts of a change in the transmittance of the liquid crystal ΔSLP, which respectively correspond to the differences between the adjoining gray scale levels of the image data DA, are equal to one another.

Meanwhile, the driving circuit illustrated in FIG. 28 performs the γ correction, as described above. Thus, the γ correction circuit 91 becomes necessary. Furthermore, there is a tendency to increase the size of the liquid crystal panel. The length of the signal line 99 increases with increase in the size of the panel. Thus, when the liquid crystal panel increases in size, the value of the parasitic capacitance Cs tends to increase. On the other hand, the DA converter 93 applies a desired voltage to the signal line 99 by transferring charges between the parasitic capacitor 940 and a group of the capacitive devices 941 to 948. Therefore, when the value of the parasitic capacitance Cs increases, it is necessary to increase the capacitive value of each of the capacitive devices 941 to 948. Generally, the capacitive devices take up a large area in the integrated circuit. Consequently, this hinders the miniaturization of the driving circuit.

Further, there has been devised an alternative measure to raise the voltage to be supplied to the capacitive devices 941 to 948 of the DA converter 93, instead of increasing the sizes thereof. However, in the case of employing TFTs as the devices of the driving circuit, there is an upper limit to the power supply voltage to the withstand voltages of such devices, and about 20 V at most.

On the other hand, there is an alternative measure to constitute the driving circuit by using amplifiers without using the DA converter 93, and to impart the γ correction function to the signal line driving circuit. However, the power consumption of the amplifier is extremely high. Therefore, the amplifier is not suitable for use in the driving circuit of the liquid crystal display device that is essentially advantageous in low power consumption. Additionally, if an operational amplifier which may consist of TFTs is formed on a glass substrate, variation in the operating characteristics of the operational amplifier is liable to occur.

SUMMARY OF THE INVENTION

The present invention is accomplished in view of the aforementioned problems. Accordingly, an object of the present invention is to provide a driving circuit and method which can reduce the area occupied by the circuit in an electro-optical device, and which can drive the device at low power consumption. Another object of the present invention is to provide a driving circuit and method which can reduce variation in the output characteristics of the driving circuit, and which can enhance the reliability thereof even when the driving circuit is formed in the device substrate. Another object of the present invention is to provide a driving circuit for use in an electro-optical device, which can be driven at a low voltage. Another object of the present invention is to provide an electro-optical panel using such a driving circuit, and to provide electronic equipment having such an electro-optical panel.

It is assumed that a driving method for driving an electro-optical device is applied to an electro-optical device having a plurality of scanning lines, a plurality of signal lines, a plurality of transistors connected to the scanning lines and the signal lines, and a plurality of pixel electrodes connected to the transistors. Further, this driving method may consist of the steps of charging a reset voltage into parasitic capacitance of the signal line, charging a reference voltage into an internal capacitance, and transferring charges between the internal capacitance and the parasitic capacitance. Moreover, the steps of charging a reference voltage into the internal capacitance, and transferring the charges are repeated a number of times, which is determined according to a value indicated by image data.

According to this method of the present invention, first, the reset voltage is charged into a parasitic capacitance of the signal line. Note that a voltage corresponding to a black level or to a white level is quickly charged into the capacitance of the signal line, by preliminarily selecting the voltage corresponding to the black level or to the white level as the reset voltage. Next, the reference voltage is charged into the internal capacitance of the signal line, and subsequently, charges are transferred between the internal capacitance and the parasitic capacitance. Thus, the voltage of the signal line can be adjusted. Incidentally, the number of times of repeating the steps of charging and transferring charges corresponds to a value indicated by the image data.

In the case of this method, it is preferable that the transistors are turned on after the step of charging the reference voltage into the internal capacitance and the step of transferring the charges are repeated a number of times, which corresponds to the value indicated by the image data. In this case, after a voltage corresponding to the value indicated by the image data is charged into the parasitic capacitance of the signal line, this voltage can be applied to the pixel electrode.

Furthermore, it is assumed that another driving method for driving an electro-optical device according to the present invention is applied to an electro-optical device having a plurality of scanning lines, a plurality of signal lines, a plurality of transistors connected to the scanning lines and the signal lines, and a plurality of pixel electrodes connected to the transistors. Further, first, one of a predetermined first reset voltage and a predetermined second reset voltage is selected according to the most significant bit of the image data. Then, the selected voltage is supplied to the signal line (in step a). Next, one of the first reference voltage and the second reference voltage is selected according to the most significant bit of the image data. Then, the selected voltage is supplied to the internal capacitance (in step b). Next, the transfer of charges between the internal capacitance and the parasitic capacitance is performed (in step c). Moreover, the steps b and c are repeated a number of times, which corresponds to a value indicated by low order bits of the image data which are other than the most significant bit of the image data.

In the case that the electro-optical material used in the electro-optical device is, for example, a liquid crystal, the gradient of a transmittance characteristic curve representing a ratio of a transmittance of the liquid crystal to an applied voltage increases with an increase in the applied voltage. Further, in a region in which the applied voltage is high and the transmittance is low, the gradient of the characteristic curve increases with decrease in the applied voltage. Further, a change in the gradient of the transmittance characteristic curve in a region in which the transmittance is high is in inverse relation to a change in the gradient of the transmittance characteristic curve in another region in which the transmittance is lower. Namely, the transmittance characteristic curve is nearly symmetric with respect to a point corresponding to a transmittance of 50%. Thus, it is necessary that the γ correction characteristic is established in such a way as to be symmetric with respect to a central value of the values indicated by the image data. To this end, there is the need for deciding whether or not the value indicated by the image data is larger than the central value, and changing the magnitude relation the reset voltage and the reference voltage into the inverted magnitude relation therebetween according to a result of this decision. According to the present invention, the reset voltage and the reference voltage are selected according to the most significant bit of the image data. Further, the transfer of charges is repeated a number of times which corresponds to the value indicated by the low order bits of the image data. Thus, a DA conversion is performed on the image data by performing the γ correction.

Furthermore, it is assumed that another driving method for driving an electro-optical device according to the present invention is applied to an electro-optical device having a plurality of scanning lines, a plurality of signal lines, a plurality of transistors connected to the scanning lines and the signal lines, and a plurality of pixel electrodes connected to the transistors. Further, first, one of a predetermined first reset voltage and a predetermined second reset voltage is selected according to a plurality of high order bits of the image data. Then, the selected voltage is supplied to the signal line (in step a). Next, one of a predetermined reference voltages is selected according to the plurality of high order bits of the image data. Then, the selected voltage is supplied to the internal capacitance (in step b). Next, the transfer of charges between the internal capacitance and the parasitic capacitance is performed (in step c). Moreover, the steps b and c are repeated a number of times, which corresponds to a value indicated by low order bits of the image data, which are other than the plurality of high order bits of the image data.

According to this method of the present invention, one of the reset voltage and the reference voltage is selected according to the value indicated by the plurality of high order bits of the image data. Thus, the γ correction characteristic curve can be divided into a plurality of ranges of the number that corresponds to the number of the high order bits. Further, the γ correction characteristic can be adjusted in each of the ranges obtained by the division. Therefore, the accuracy of the γ correction characteristic can be improved.

Next, a DA converter of the present invention is used in a driving circuit for driving an electro-optical device having a plurality of scanning lines, a plurality of signal lines, a plurality of transistors connected to the scanning lines and the signal lines, and a plurality of pixel electrodes connected to the transistors. Further, this DA converter has a plurality of DA units respectively connected to signal lines. Moreover, each of the DA units has a first charging portion for charging the reset voltage into the parasitic capacitance of the signal line, a second charging portion provided with an internal capacitance for charging the reference voltage into the internal capacitance and for transferring charges between the internal capacitance and the parasitic capacitance after the reference voltage is charged into the internal capacitance, and a control portion for controlling the first charging portion in such a way so as to charge the reset voltage into the parasitic capacitance, and for then controlling the second charging portion in such a way as to repeat the charging and the transfer of charges a number of times corresponding to a value indicated by predetermined low order bits of the image data.

Generally, the capacitance or capacitor occupies a large area. However, the DA converter incorporates a single internal capacitance. Therefore, according to the present invention, the circuit scale can be reduced. Further, after the first charging portion charges the reset voltage into the parasitic capacitance, the second charging portion repeats the charging and the transfer of charges a number of times corresponding to a value indicated by the predetermined low order bits of the image data. Consequently, the DA conversion can be performed by simultaneously performing the γ correction. Thus, there is no need for providing a γ correction circuit in the preceding stage of the DA converter.

Incidentally, preferably, the control portion has a counter for counting the number of times of the charging and the transfer of charges, a comparator for comparing the count value of the counter with the value indicated by the low order bits of the image data, and a control signal generating circuit for generating a control signal used for controlling the second charging portion to perform the charging and the transfer of charges according to a result of a comparison. According to this control portion of the present invention, the number of times for performing the charging and the transfer of charges can be made to be equal to the value indicated by the predetermined low order bits of the image data.

Further, the aforementioned DA converter has a counter for counting the number of times for charging and transferring of charges and for outputting count data representing a count value. Preferably, the control portion of each of the aforementioned DA units has a comparator for comparing the count data with a value represented by the low order bits, and a control signal generating circuit for generating a control signal used to control the second charging portion in such a manner so as to cause the charging and the transfer of charges according to a result of a comparison. According to this circuit of the present invention, the counter can be used in common among the DA units. Thus, the circuit scale of the DA converter is considerably reduced.

Moreover, the aforementioned DA converter may have a first selection circuit for selecting one of a first reset voltage and a second reset voltage according to the most significant bit of the image data and for supplying the selected voltage to the first charging portion as the reset voltage, and a second selection circuit for selecting one of a first reference voltage and a second reference voltage according to the most significant bit of the image data and for supplying the selected voltage to the second charging portion as the reference voltage. According to this circuit of the present invention, a DA conversion can be performed by simultaneously performing a γ correction.

Furthermore, preferably, in the DA converter having first and second selection circuits, the first charging portion has a first switch connected between the first selection circuit and the signal line. The second charging portion has a second switch connected between the second selection circuit and the internal capacitance, and a third switch connected between the internal capacitance and the signal line. It is preferable that the control portion first turns on the first switch, that then, the control portion turns off the first switch, and that subsequently, the control portion alternately turns on and off the second and third switches a number of times corresponding to a value indicated by the low order bits other than the most significant bit of the image data. According to this circuit of the present invention, the reset voltage is charged into the parasitic capacitance by controlling the on/off of the first switch. Further, the charging of the internal capacitance and the transfer of charges between the internal capacitance and the parasitic capacitance are alternately performed by alternately turning on and off the second and third switches. Thus, the DA converter can perform a DA conversion by simultaneously performing a γ correction on the image data.

Additionally, the aforementioned DA converter may have a first selection circuit for selecting one of a first reset voltage and a second reset voltage according to the most significant bit of the image data and for supplying the selected voltage to the first charging portion as the reset voltage, and a second selection circuit for selecting one of a first reference voltage and a second reference voltage according to the most significant bit of the image data and for supplying the selected voltage to the second charging portion as the reference voltage. According to this circuit of the present invention, a DA conversion can be performed by simultaneously performing a γ correction.

Moreover, preferably, in the DA converter having first and second selection circuits, the first charging portion has a first switch connected between the first selection circuit and the signal line. The second charging portion has a second switch connected between the second selection circuit and one of two terminals of the internal capacitance, a third switch connected between the second selection circuit and the other terminal of the internal capacitance, a fourth switch connected between the signal line and one of two terminals of the internal capacitance, and a fifth switch connected between the signal line and the other terminal of the internal capacitance. It is preferable that the control portion first turns on the first switch, that then, the control portion turns off the first switch, and that subsequently, the control portion alternately turns on and off a pair of the second and fifth switches and a pair of the third and fourth switches a number of times, which corresponds to a value indicated by the low order bits other than the most significant bit of the image data.

According to this circuit of the present invention, the reset voltage is charged into the parasitic capacitance by controlling the on/off of the first switch. Further, two pairs of the switches are alternately turned on and off. Thus, during one of the pairs of the switches is turned on, the other pair of the switches is turned off. Therefore, each time the on-state and the off-state thereof are switched, the charging of the internal capacitance and the transfer of charges between the internal capacitance and the parasitic capacitance are simultaneously performed. Thus, the gradient of an output voltage characteristic curve can be increased. In other words, even when a ratio of the value of the internal capacitance to the value of the parasitic capacitance is reduced, desired output voltage characteristics can be obtained. Hence, a capacitor having a small occupied area can be used as the internal capacitance.

Further, the aforementioned DA converter may have a selection circuit for selecting one of a plurality of sets of a reset voltage and a reference voltage according to a plurality of high order bits of the image data, for outputting the selected reset voltage from a reset voltage output terminal to thereby supply the selected reset voltage to the first charging portion, and for outputting the selected reference voltage output terminal from a reference voltage output terminal to thereby supply the selected reference voltage to the second charging portion. According to this circuit of the present invention, a set of a reset voltage and a reference voltage is selected according to a plurality of high order bits of the image data. Thus, the output voltage characteristic of the DA converter is generated by being divided into a plurality of ranges corresponding to the values of the image data. Therefore, the output voltage characteristic corresponding to each of the ranges is determined the selected set of the reset voltage and the reference voltage. Consequently, the output voltage characteristic of the DA converter can be brought close to an ideal γ correction characteristic by suitably setting the reset voltage and the reference voltage.

Furthermore, preferably, in the DA converter having a selection circuit, the first charging portion has a first switch connected between the reset voltage output terminal and the signal line. The second charging portion has a second switch connected between the reference voltage output terminal and the internal capacitance, and a third switch connected between the internal capacitance and the signal line. It is preferable that the control portion first turns on the first switch, that then, the control portion turns off the first switch, and that subsequently, the control portion alternately turns on and off the second and third switches a number of times, which corresponds to a value indicated by the low order bits other than the plurality of high order bits of the image data. According to this circuit of the present invention, the reset voltage is charged into the parasitic capacitance by controlling the on/off of the first switch. Further, the charging of the internal capacitance and the transfer of charges between the internal capacitance and the parasitic capacitance are alternately performed by alternately turning on and off the second and third switches. Thus, the DA converter can perform a DA conversion by simultaneously performing a γ correction on the image data.

Additionally, preferably, in the DA converter having a selection circuit, the first charging portion has a first switch connected between the reset voltage output terminal and the signal line. The second charging portion has a second switch connected between the reference voltage output terminal and one of two terminals of the internal capacitance, a third switch connected between the reference voltage output terminal and the other terminal of the internal capacitance, a fourth switch connected between the signal line and one of two terminals of the internal capacitance, and a fifth switch connected between the signal line and the other terminal of the internal capacitance. It is preferable that the control portion first turns on the first switch, that then, the control portion turns off the first switch, and that subsequently, the control portion alternately turns on and off a pair of the second and fifth switches and a pair of the third and fourth switches a number of times, which corresponds to a value indicated by the low order bits other than the plurality of high order bits of the image data.

According to this circuit of the present invention, the gradient of an output voltage characteristic curve can be increased. In other words, even when the ratio of the value of the internal capacitance to the value of the parasitic capacitance is reduced, desired output voltage characteristics can be obtained. Thus, a capacitor having a small occupied area can be used as the internal capacitance.

Next, a signal driving circuit of the present invention has the aforementioned DA converter, and may consist of a shift register adapted to sequentially generate selection pulses respectively corresponding to signal lines by sequentially shifting a start pulse, a first latch portion adapted to output image data respectively corresponding to the signal lines by sequentially latching the image data according to the selection pulses, and a second latch portion adapted to latch the image data outputted from the first latch portion according to a latch pulse of one horizontal scanning period and to output the latched image data to the DA converter. According to this circuit of the present invention, the first latch portion generates point sequential image data. The second latch portion converts the point sequential image data to line sequential image data. Further, the DA converter performs a DA conversion by simultaneously performing a γ correction according to the line sequential image data.

Next, a driving circuit of an electro-optical device of the present invention has the aforementioned signal line driving circuit, and a scanning line driving circuit for supplying scanning signals to the scanning lines, respectively, after a moment at which an operation of the second charging portion is terminated, when the value indicated by the low order bits is a maximum value. According to this circuit of the present invention, the scanning signal is active after the operation of the second charging portion is terminated, regardless of the value indicated by the image data. Thus, after a desired voltage is charged into the parasitic capacitance of the signal line, the transistor is turned on. Then, such a voltage can be applied to the pixel electrode.

Next, it is assumed that an electro-optical panel of the present invention comprises a device substrate, an opposing substrate having an opposing electrode, and a liquid crystal filled in the gap between the device substrate and the opposing electrode. Further, in this electro-optical panel, the aforementioned driving circuit, the plurality of signal lines, the plurality of scanning lines, transistors connected to the signal lines and to the scanning lines, and pixel electrodes connected to the transistors are formed on the device substrate. According to this panel of the present invention, the size of the entire system can be reduced, as compared with a panel in which the driving circuit is formed as a chip that is different from pixel regions.

Incidentally, preferably, the aforementioned transistors and those of the driving circuit are thin film transistors. According to this panel of the present invention, the pixel regions and the driving circuit can be formed in the same process. Further, especially, in the case that a glass substrate is employed as the device substrate, there is caused a variation in the operating characteristics of the thin film transistors. However, in the case of this driving circuit, desired voltages can be applied to the signal lines by transferring charges between the internal capacitance and the parasitic capacitance. Thus, even when the driving circuit is constructed by using thin film transistors, a DA conversion can be accurately performed.

Next, a projection display device of the present invention comprises the aforementioned electro-optical panel, a light source for irradiating the electro-optical panel with light, and a projection optical mechanism for enlargedly projecting light having passed through the electro-optical panel. Thus, the present invention provides a compact projection display device, which can show an image with good picture quality at low power consumption.

Next, the electronic equipment of the present invention having the aforementioned electro-optical panel is adapted to display an image on such an electro-optical panel. Consequently, the present invention provides electronic equipment having a low-power-consumption compact display device. Further, such electronic equipment is, for example, an engineering workstation, a pager, a hand-portable telephone set, a television set, a viewfinder type or direct-view-type camcorder, and a car navigation device.

BRIEF DESCRIPTION OF THE DRAWINGS

FIG. 22 is a table showing the corresponding relation among the reset voltages Vr0 to Vr7, the reference voltages Va0 to Va7, and the high order three bits of the image data D3, D4, D5;

DETAILED DESCRIPTION OF THE EMBODIMENTS

Hereinafter, embodiments of the present invention will be described by referring to the accompanying drawings.

1. First Embodiment

1-1. Entire Configuration of Liquid Crystal Display Device

First, a liquid crystal display device employing a liquid crystal as an electro-optical material will be described hereinbelow as an example of an electro-optical device according to the present invention. A primary part of the liquid crystal display device is constituted by a liquid crystal panel AA having a device substrate and an opposing substrate which are stuck together so that electrode-mounted surfaces of the substrates are opposed to each other, that a uniform gap is provided therebetween, and that a liquid crystal is put in this gap and held therebetween. Incidentally, TFTs are formed on the device substrate as switching elements. Although a glass substrate is used in this embodiment as the device substrate, needless to say, a semiconductor substrate may be employed as the device substrate instead of the glass substrate.

Figure 1:
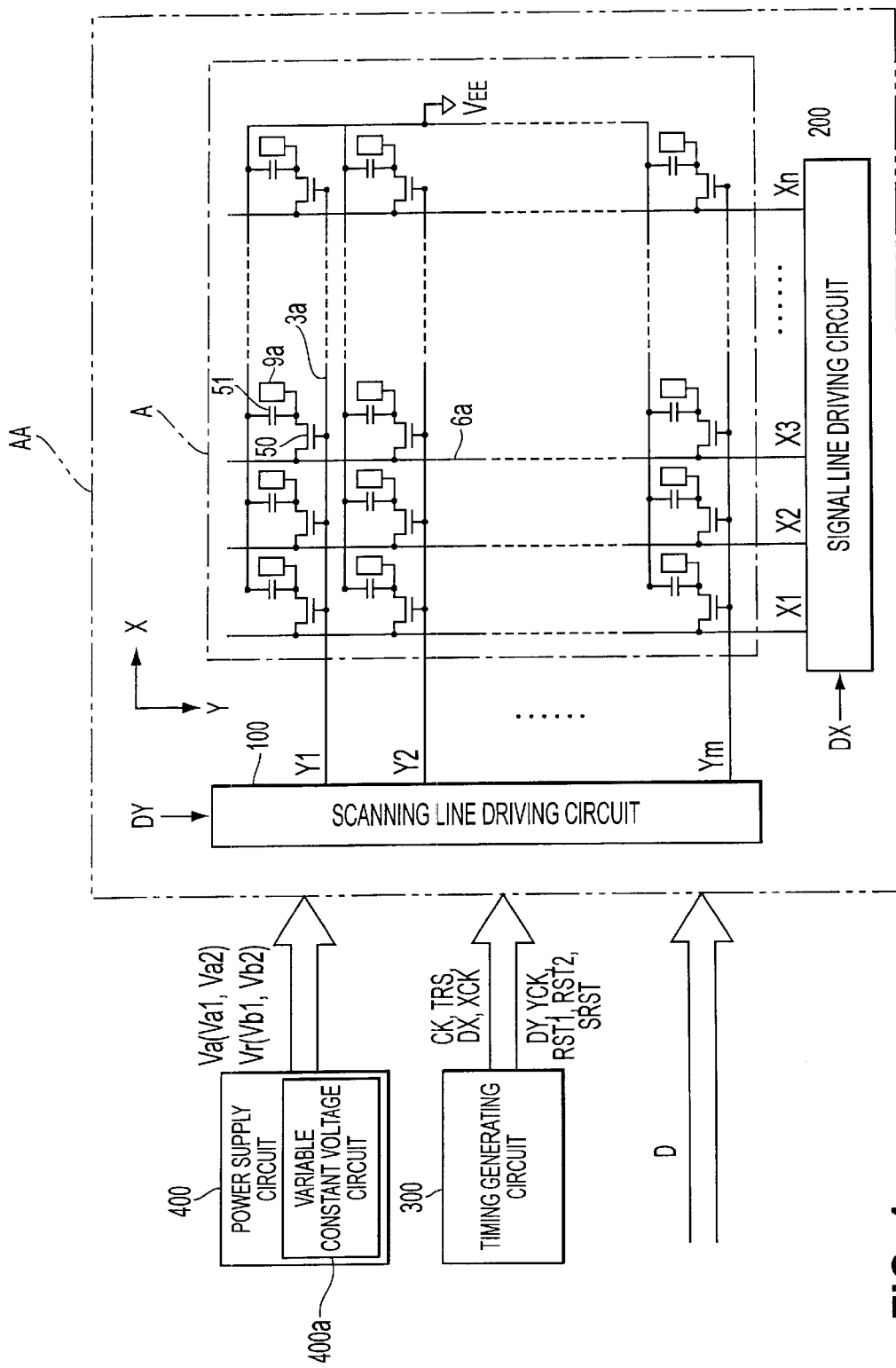
FIG. 1 is a block diagram illustrating the entire configuration of a liquid crystal display device, which is a first embodiment of the present invention.

FIG. 1 is a block diagram showing the entire configuration of the liquid crystal display device of this embodiment. This liquid crystal display device comprises the liquid crystal panel AA and external processing circuits. An image display region A, a scanning line driving circuit 100, and a signal line driving circuit 200 are formed on the device substrate of the liquid crystal display device AA. Incidentally, active devices of each of circuits provided on the device substrate are constituted by TFTs.

Further, the liquid crystal display device has a timing generating circuit 300 and a power supply circuit 400 as the external processing circuits.

Image data D to be supplied to this liquid crystal display device is of parallel format. The following description of this embodiment is given by assuming that the number of bits representing the image data D is 6 in this embodiment. Moreover, for simplification of the following description, it is assumed that the image data D is generated in such a manner so as to correspond to one color. However, image data used in the device of the present invention is not limited thereto. Image data generated in such a way as to correspond to RGB three primary colors may be used.

Incidentally, the timing generating circuit 300 generates Y clock signals YCK, X clock signals XCK, Y transfer start pulse signals DY, X transfer start pulse signals DX, and latch pulse signals TRS in synchronization with the input image data D. Furthermore, the timing generating circuit 300 supplies these signals to the scanning line driving circuit 100 and the signal line driving circuit 200.

Further, the power supply circuit 400 is constituted by a constant voltage circuit, and generates a power supply voltage for each of the circuits formed on the device substrate of the liquid crystal panel AA. Moreover, the power supply circuit 400 generates reference voltages Va (Va1, Va2) and reset voltages Vr (Vb1, Vb2) used in the DA converter portion 240 described later.

1-2. Image Display Region

As illustrated in FIG. 1, m scanning lines 3a are formed in the image display region A in such a manner as to be arranged along X-direction and parallel to one another. Further, n signal lines 6a are formed therein in such a way as to be arranged along Y-direction and parallel to one another. A gate, a source, and a drain of each of TFTs 50 are respectively connected to the corresponding scanning line 3a, the corresponding signal line 6a, and the corresponding pixel electrode 9a in the vicinity of each intersection of the corresponding scanning line 3a and the corresponding signal line 6a. Furthermore, each of pixels is constituted by a pixel electrode 9a, an opposing electrode formed on the opposing substrate, and a liquid crystal sandwiched between these electrodes. As a result, the pixels are arranged in a matrix-like manner so that each of the pixels corresponds to a corresponding one of the intersections of the scanning lines 3a and the signal lines 6a.

Further, scanning signals Y1, Y2, . . . , Ym are applied like pulses to the scanning lines 3a respectively connected to the gates of the TFTs 50 in a line sequential manner. When a scanning signal is supplied to a certain one of the scanning lines 3a, one of the TFTs 50 connected to this scanning line is turned on. Thus, each of image signals X1, X2, . . . , Xn supplied from the signal lines 6a with the predetermined timing is held by a corresponding pixel for a predetermined time after being written to the corresponding pixel.

Incidentally, note that the alignment and order of liquid crystal molecules change according to the level of a voltage applied to each of the pixels. Thus, a gray scale display utilizing optical modulation is enabled. For instance, an amount of light passing through the liquid crystal is limited with an increase in the voltage applied thereto in a normally white mode. In contrast, in a normally black mode, the limit to such an amount of light is alleviated with an increase in the applied voltage. Therefore, light with a contrast determined according to an image signal is outputted from each of the pixels so that a predetermined display is enabled. Incidentally, the image display region A of this embodiment is constructed in such a manner so as to operate in the normally white mode.

Further, a storage capacitor 51 is added thereto in parallel with a liquid crystal capacitor formed between the pixel electrode 9a and the opposing electrode. For example, the voltage of the pixel electrode 9a is held by the storage capacitor 51 for a time period longer than the time period during which a source voltage is applied thereto, by three digits. Therefore, the holding characteristics are improved by using the storage capacitor 51. Consequently, a high contrast ratio is realized in the liquid crystal display device.

1-3. Scanning Line Driving Circuit

Next, regarding the scanning line driving circuit 100, this circuit has a Y shift register and a level shifter (not shown). The Y shift register is operative to shift a signal DY, which represents a start of a vertical scanning period, in Y-direction by using a Y clock YCK to be inverted every horizontal scanning period, and operative to output the shifted signals in sequence. The level shifter is operative to perform the level shift on each of the output signals of the Y shift register and to output resultant signals as scanning signals Y1, Y2, . . . , Ym. The scanning signals Y1, Y2, . . . , Ym are supplied like pulses to the scanning lines 3a in a line sequential manner. Incidentally, the scanning signals. Y1, Y2, . . , Ym become active after a DA conversion operation (to be described later) is terminated and voltages corresponding to the values represented by the image data D are applied to the scanning lines 6a.

1-4. Signal Line Driving Circuit

Figure 2:
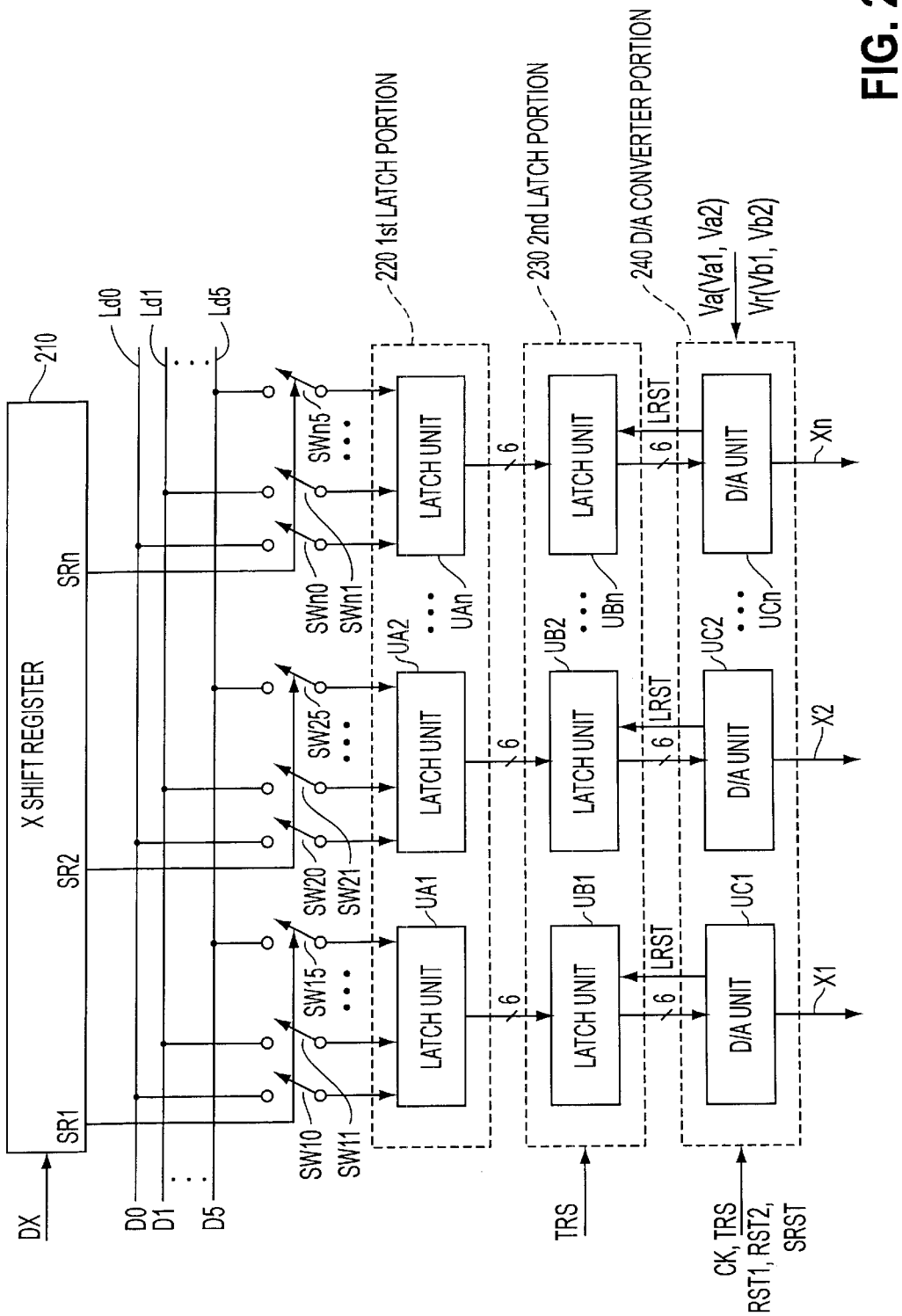
FIG. 2 is a block diagram illustrating a signal line driving circuit used in the liquid crystal display device.

Next, a signal line driving circuit 200 will be described hereinbelow. FIG. 2 is a block diagram illustrating the signal line driving circuit 200. As illustrated in FIG. 2, the signal line driving circuit 200 has an X shift register 210, image data supply lines Ld0 to Ld5 to be supplied with image data D0 to D5, switches SW10 to SWn5, a first latch portion 220, a second latch portion 230, and a DA converter portion 240.

The image data supply lines LD0 to Ld5 are adapted to be supplied with data D0 to D5 representing the values respectively indicated by bits of the image data D.

The X shift register 210 is constituted by latch circuits connected in a multi-stage connection. This X shift register 210 serially generates sampling pulses SR1, SR2, ..., SRn by sequentially shifting an X transfer start pulse DX according to an X clock XCK.

Next, regarding switches SW10 to SWn5, these switches are constituted by TFTs. Further, the switches SW10 to SWn5 are grouped into n sets, each of which consists of 6 switches, namely, switches SW10 to SW15, SW20 to SW25, ..., SWn0 to SWn5. These sets of switches will be hereunder referred to as "switch groups". The number of switch groups corresponds to the number of signal lines 6a and is "n". Further, the switches of each of the switch groups are connected to image data supply lines LD0 to Ld5, respectively. Moreover, n sampling pulses SR1, SR2, ..., SRn are supplied to the switch groups, respectively. Thus, the image data D0 to D5 are latched by the first latch portion 220 in synchronization with the sampling pulses SR1, SR2, ..., SRn.

Next, regarding the first latch portion 220, this latch portion is constituted by n latch units UA1 to UAn. Each of the latch units UA1 to UAn latches the image data D0 to D5 supplied from the switch groups. Thus, the image data D to be scanned in a point sequential manner is obtained. Further, the second latch portion 230 is constituted by n latch units UB1 to UBn. Each of the latch units UB1 to UBn is configured in such a manner so as to latch output data of the first latch portion 220 in synchronization with a latch pulse TRS. The latch pulse TRS becomes active each single horizontal scanning period. Thus, this second latch portion 230 converts the data outputted in a point sequential manner from the first latch portion 220, into line sequential data. In other words, the image data D0 to DS are converted into line sequential data corresponding to the signal lines 6a using the switches SW10 to SWn5, the first latch portion 220, and the second latch portion 230.

Next, regarding the DA converter portion 240, this portion has n DA units UCI to UCn respectively corresponding to the n signal lines 6a. A primary part of each of the DA units UC1 to UCn is constituted by a 1-bit pulse width modulation (PWM) DA converter.

1-5. DA Converter Portion 1-5-1: Principle of DA Conversion

The DA converter portion 240 has the function of converting the image data D from a digital signal to an analog signal by simultaneously performing a γ correction data D. Before describing the DA converter portion 240 in detail, the principle of the DA conversion, which is applied to this embodiment together with a γ correction, will be described hereinbelow.

Figure 3:
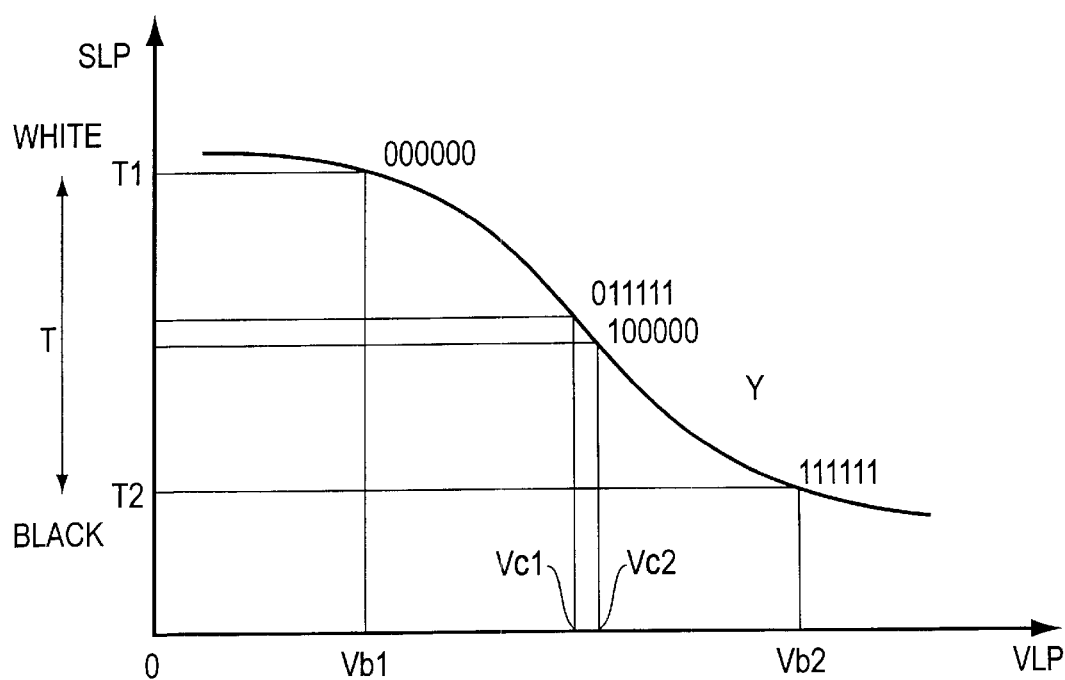
FIG. 3 is a graph illustrating the relation between the voltage VLP applied to the liquid crystal of each pixel, and the transmittance SLP thereof.

FIG. 3 is a graph illustrating the relation between the applied voltage VLP, which is applied to the liquid crystal of a pixel, and the transmittance SLP of the pixel. In the case of an example of FIG. 3, the liquid crystal operates in a normally white mode. As illustrated in FIG. 3, the transmittance characteristic curve Y is an inverted-S-like curve. A transmittance variation range T is determined from this transmission characteristic curve Y. The wider the transmittance variation range T, the larger the contrast ratio of the display device. Thus, the picture quality of an image can be enhanced.

However, the transmittance SLP largely varies with respect to the applied voltage VLP in an intermediate range. In contrast, the transmittance SLP is nearly constant in a region in which the applied voltage VLP has a large value (which is not less than Vb2), or a region in which the applied voltage VLP has a small value (which is not more than Vb1).

Thus, as illustrated in FIG. 3, the range between T1 and T2 is selected as a transmittance variation range. Incidentally, the value of the applied voltage VLP corresponding to the maximum transmittance value T1 is Vb1. In contrast, the value of the applied voltage VLP corresponding to the minimum transmittance value T2 is Vb2.

In the case that the image data D is represented by 6 bits, similarly as in the case of this embodiment, it is necessary that the value of the applied voltage of the liquid crystal is Vb1 when the image data D is "000000", and that the value of the applied voltage of the liquid crystal is Vb2 when the image data D is "111111". Further, it is necessary for performing a γ correction according to the transmittance characteristics of the liquid crystal that the width of the range of a change in the transmittance is constant when the image data D serially changes from "000000" to "111111". For example, it is necessary that the magnitude of a change in the transmittance at the time of serially changing the image data D from "000000" to "000001" is equal to the magnitude of a change in the transmittance at the time of serially changing the image data D from "011111" to "111111".

Thus, the DA converter portion 240 needs to meet the aforementioned two conditions. Hereinafter, the function of the DA converter 240, and the fulfillment of the two conditions by performing the function will be described hereinbelow.

First, the parasitic capacitance CS, which is associated with the signal line 6a and is a prerequisite for the DA conversion, will be described hereinbelow. The parasitic capacitance CS is formed mainly between the signal line 6a formed on the device substrate and the electrode formed on the opposing substrate that is opposed to the device substrate through the liquid crystal. Further, in the image display region A, the signal line 6a intersects with the scanning line 3a, and the pixel electrodes respectively corresponding to the adjoining pixels are disposed close to each other. Thus, the parasitic capacitance CS is generated. Namely, the signal line 6a has the parasitic capacitance CS associated therewith and caused owing to the other constituent elements even if no capacitor is positively provided therein. This embodiment performs a DA conversion of the image data D by utilizing the parasitic capacitance CS of the signal line 6a.

From the viewpoint of functions, the DA converter portion 240 is constituted by the first charging portion C1 and the second charging portion C2. The first charging portion C1 charges a predetermined voltage into the parasitic capacitance CS having a capacitive value C2. On the other hand, the second charging portion C2 has an internal capacitance CD, whose capacitive value is Cd, and a switch portion SW provided between the internal capacitance CD and the parasitic capacitance CS.

Figure 4:
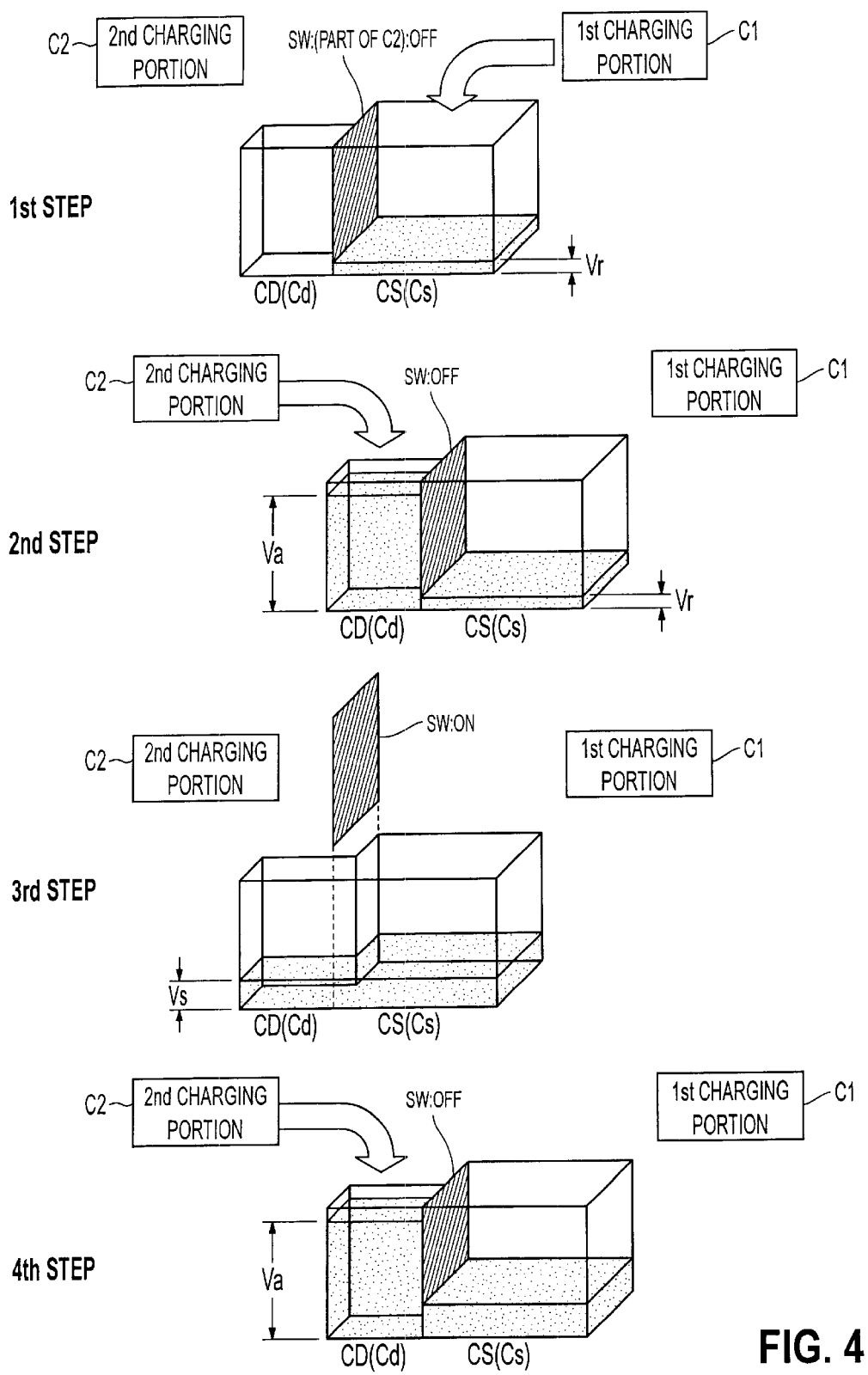
FIG. 4 is a conceptual diagram illustrating the principle of a DA conversion according to the present invention.

FIG. 4 is a conceptual diagram illustrating the principle of the DA conversion. First, when the switch portion SW is an off-state, the first charging portion C1 charges the parasitic capacitance CS (in a first step) to the voltage Vr. This reset voltage Vr is a predetermined voltage for initializing the voltage of the signal line. Subsequently, the second charging portion C2 charges the internal capacitance CD (in a second step) to a voltage Va (hereunder referred to as a reference voltage) while the switch portion SW remains in the off-state. Next, the switch portion is put into an on-state (in a third step). Then, the transfer of charges occurs between the internal capacitance CD and the parasitic capacitance CS. Actually, charges flow into the parasitic capacitance CS from the internal capacitance CD. Finally, the voltage of the internal capacitance CD becomes equal to that of the parasitic capacitance CS. Next, the switch portion SW is turned off. Then, the second charging portion C2 charges the internal capacitance CD again (in a fourth step). Thence, the third and fourth steps are repeated. Consequently, the voltage of the parasitic capacitance CS can be made to have a desired value.

Incidentally, let Vc(N) denote a charging voltage of the parasitic capacitance CS (that is, the voltage of the signal line) when the switch portion SW is turned on N times. Then, the voltage Vc(N) is given by the following equations. That is, in the case that N=0, namely, in the case that the charging of the parasitic capacitance CS is finished only in the first step, Vc(N)=Vr.

In the case that N is not less than 1, Vc(N) is given by the following equations.

$$N=1: Vc(1)=\{Cd/(Cs+Cd)\}(Va-Vr)+Vr$$

$$N=2: Vc(2)=\{Cd/(Cs+Cd)\}(Va-Vc(1))+Vc(1)$$

...

$$N=n: Vc(n)=\{Cd/(Cs+Cd)\}(Va-Vc(n-1))+Vc(n-1)$$

Incidentally, let $\alpha$ designate a ratio of the capacitive value of the parasitic capacitance Cs to that of the internal capacitance Cd (namely, $\alpha$=Cd/Cs). Then, Vc(N) is given by the following equation (1):

$$Vc(N)=\{\alpha/(1+\alpha)\}(Va-Vc(n-1))+Vc(n-1) \qquad (1)$$

As is understood from equation (1), Vc(N) is determined by Va, Vr and $\alpha$. Incidentally, the value of the internal capacitance Cd is selected in such a manner as to be sufficiently small, as compared with the value of the parasitic capacitance Cs.

Figure 5:
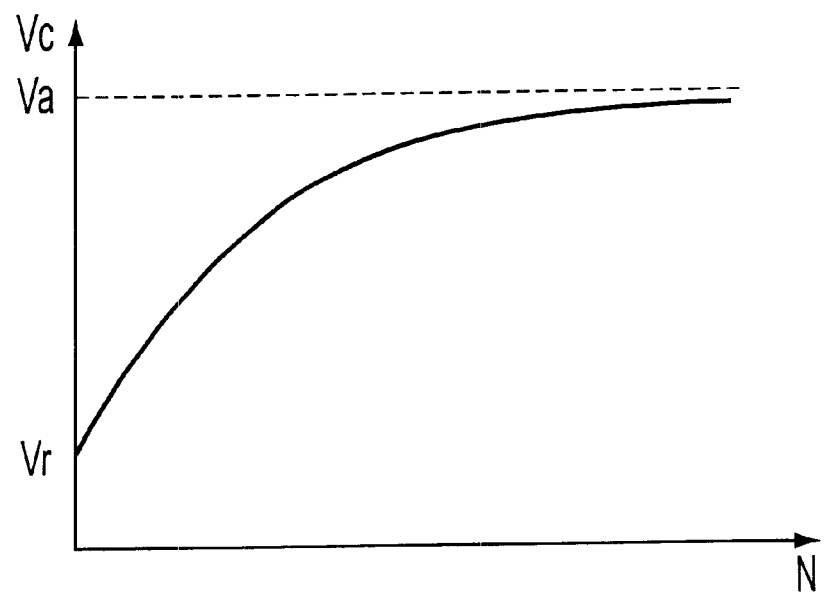
FIG. 5 is a graph illustrating the relation between the charging voltage and the number of times of performing charging and discharging operations in the case that Vd>Vs.
Figure 6:
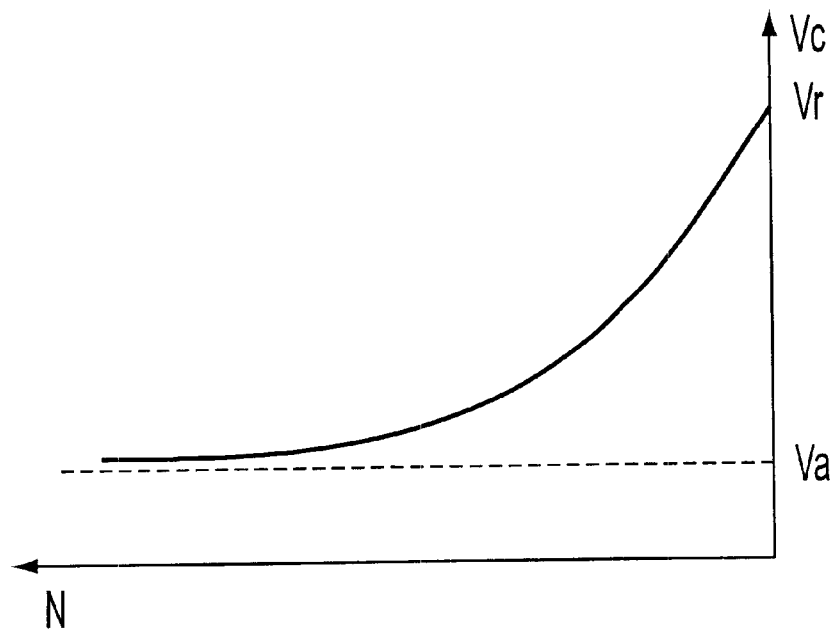
FIG. 6 is a graph illustrating the relation between the charging voltage and the number of times of performing charging and discharging operations in the case that Vd<Vs.

FIG. 5 is a graph illustrating the relation between Vc(N), which is represented by an axis of ordinate, and N representing the number of times of charging/discharging, which is represented by the axis of abscissa. As is apparent from this graph, the charging voltage Vc(N) of the parasitic capacitance Cs monotonously increases from the reset voltage Vr with increase in the number (N) of times of charging/discharging and then asymptotically approaches the reference voltage Va. Although Va>Vr in the example of FIG. 5, the relation between the charging voltage Vc(N) and the number N of times of charging and discharging operations is as illustrated in FIG. 6, in the case that Vr>Va. As is seen from FIG. 6, in the latter case, the charging voltage Vc(N) of the parasitic capacitance Cs monotonously decreases from the reset voltage Vr with increase in the number (N) of times of charging/discharging and then asymptotically approaches the reference voltage Va. Further, as a capacitance ratio $\alpha$ increases, the charging voltage Vc(N) asymptotically approaches Va according to equation (1). Therefore, the shapes of the curves of FIGS. 5 and 6 can be changed by adjusting Va, Vr, and $\alpha$.

Figure 7:
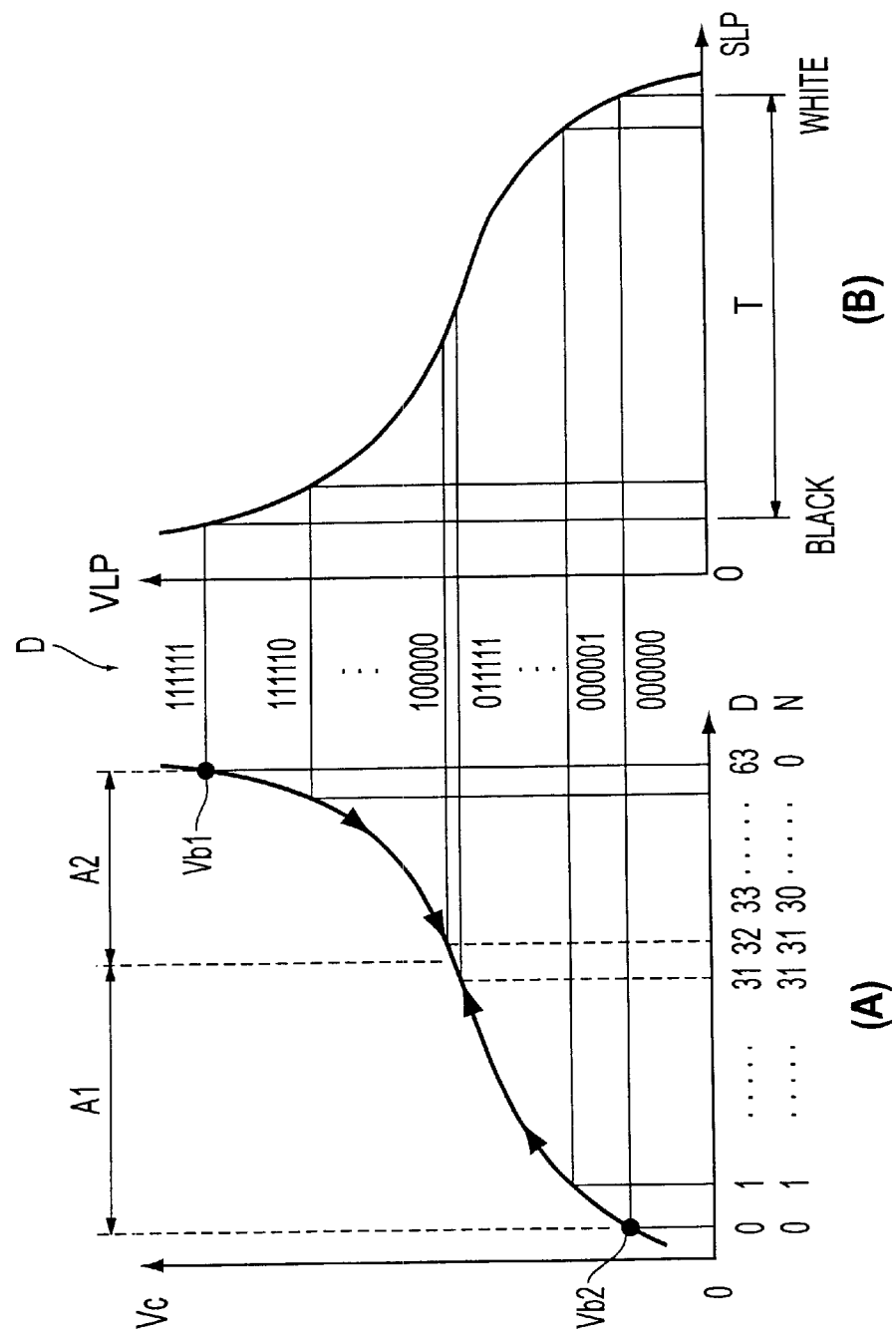
FIG. 7(A) is a graph illustrating the relation between image data and the voltage VLP of a signal line, which is necessary for obtaining a transmittance characteristic curve Y.
FIG. 7(B) is a graph illustrating the transmittance characteristic curve Y by interchanging the axis of ordinate and the axis of abscissa.

FIG. 7(B) is a graph illustrating the transmittance characteristic curve Y by interchanging the axis of ordinate and the axis of abscissa. On the other hand, FIG. 7(A) is a graph illustrating the relation between image data D and the voltage VLP of a signal line, which is necessary for obtaining a transmittance characteristic curve Y. That is, the application of a voltage corresponding to the image data onto a liquid crystal according to the output characteristic curve illustrated in FIG. 7(A) is necessary for displaying a gray scale image according to the image data by using the liquid crystal having the transmittance characteristics illustrated in FIG. 3. If the application of such a voltage is possible, an ideal $\gamma$ correction can be performed.

It is sufficient for obtaining the output characteristic curve shown in FIG. 7(A) to connect the curve of FIG. 5 to the curve of FIG. 6 at a point corresponding to the central value of the image data D. The reference voltage Va, the reset voltage Vr, and the capacitance ratio a are determined so that the output characteristics of the DA conversion becomes close to the output characteristics illustrated in FIG. 7(A) as much as possible. Although the output characteristics of the DA conversion cannot be made to be completely matched with those of FIG. 7(A), output characteristics which are similar to those of FIG. 7(A) to the extent that no practical problems occur can be obtained.

Further, the following requirements for connecting the curves of FIGS. 5 and 6 at the point corresponding to the central value of the image data D should be met. First, it is necessary to interchange the voltages Vr and Va with each other in the ranges A1 and A2 of FIG. 7(A). That is, in the range A1, the values Vb1 and Va1 need to be selected as the values Vr and Va, respectively, while in the range A2, the values Vb2 and Va2 need to be selected as the values Vr and Va, respectively. Second, in the range A1, the value indicated by the image data needs to be matched with the number N of times of charging and discharging operations, while the number N needs to be determined by converting, as illustrated in FIG. 7(A), the value indicated by the image data D. It is distinguished according to the most significant bit MSB of the image data D of the ranges A1 and A2 which contains the value indicated by the image data D.

As will be described later, the DA converter portion 240 interchanges the reset voltage Vr with the reference voltage Va according to the value of the most significant bit MSB of the image data D. Moreover, the portion 240 determines the number N according to the value indicated by 5 low order bits of the image data D.

1-5-2: Configuration of DA Converter

Next, the DA converter portion 240 will be described in detail. Although only the DA unit UC1 will be described hereinbelow, other DA units UC2 to UCn are configured, similarly as the DA unit UC1.

Figure 8:
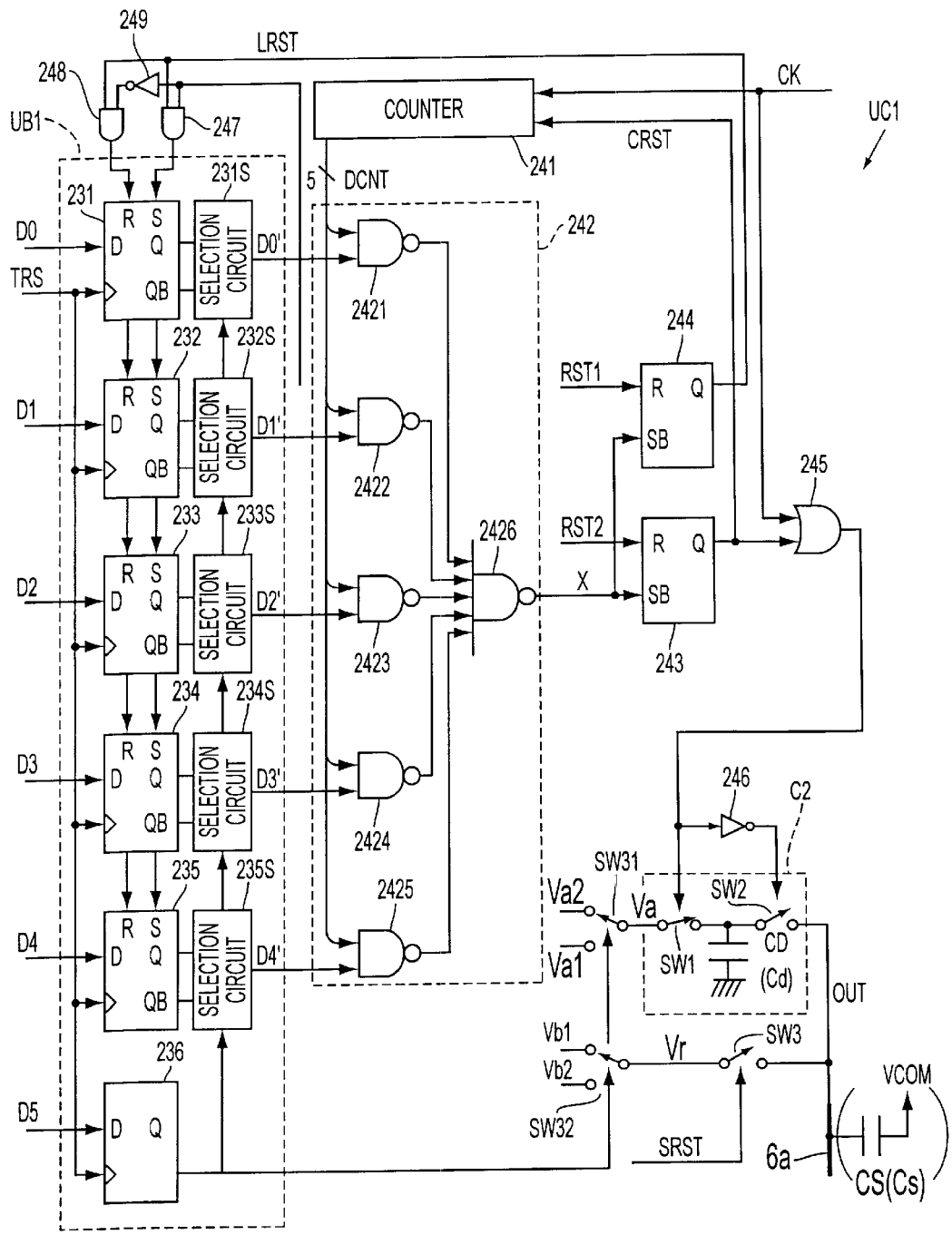
FIG. 8 is a block diagram illustrating a DA unit UC1 and peripheral circuits thereof.

FIG. 8 is a block diagram illustrating the configuration of the DA unit UC1 and peripheral circuits thereof. As illustrated in this figure, a primary part of the DA unit UC1 is constituted by a counter 241, a comparator 242, SR flip-flops 243 and 244, an OR circuit 245, and AND circuits 247 and 248, inverters 246 and 249, switches SW31, SW32, SW1, SW2, and SW3, and the internal capacitance CD. Further, an output terminal OUT of the DA unit UC1 is connected to one of the signal lines 6a, which has the parasitic capacitance CS.

First, the counter 241 is constituted by a 5-bit downcounter having a reset terminal. Further, the counter 241 counts clock pulses CK by detecting leading edges thereof, and outputs 5-bit count data DCNT which indicates a count value. Incidentally, a counter reset signal CRST is supplied to the reset terminal of the counter 241. Furthermore, the counter 241 resets the count value to "11111" when the counter reset signal CRST has a high level H. Conversely, when the counter reset signal has a low level L, the counter 241 counts the clock pulses CK. Incidentally, data respectively represented bits of count data DCNT are designated by D0' to D4'.

Next, regarding the comparator 242, this comparator comprises NAND circuits 2421 to 2425, each having two input terminals, and a NAND circuit 2426 having 5 input terminals. The comparator 242 compares data which are respectively indicated by 5 low order bits of output data of the latch unit UB1, with data D0' to D4' respectively indicated by bits of the count data DCNT. Further, the comparator 242 generates an output signal X, which has an H level when a value of at least one bit of the former data is matched with a value of a corresponding bit of the latter data, and also has an L level when a value at each of all bits of the former data is not matched with a value at a corresponding one of bits of the latter data.

It is now assumed that the value indicated by the five low order bits of the output data of the latch unit UB1 is, for instance, "00011". In this case, further, it is assumed that the initial value of data, which is denoted by "D0', . . . , D4'" of the count data DCNT is "11111". The latter data vary as follows, "11111", "11110", "11101", and "11100" in this order. Further, the signal level of the output signal X is changed from an H level to an L level at a moment when the value "D0', . . . , D4'" of the count data DCNT reaches "11100". That is, the timing with which the signal level of the output signal X is changed from an H level to an L level is determined by the value indicated by the 5 low order bits of the image data D.

Next, regarding the SR flip-flop 244, this flip-flop has an output terminal Q, a reset terminal R, and a reverse set terminal SB. When the voltage of the reset terminal R has an H level, the voltage at the output terminal Q is reset to an L level. Conversely, when the voltage at the reverse set terminal SB is an L level, the voltage at the output terminal Q is set at an H level. Further, the SR flip-flop 244 has a reset preferential function. That is, when the voltage at the reset terminal R is an H level, and the voltage at the reverse set terminal SB is an L level, the voltage at the output terminal Q becomes an L level. A first reset signal RST1 is supplied from the timing generating circuit 300 to this reset terminal R. Further, an output signal X is supplied to the reverse set terminal SB. The SR flip-flop 244 generates a latch reset signal LRST according to the first reset signal RST1 and the output signal X.

Incidentally, the latch unit UB1 comprises 6 D flip-flops 231 to 236 and selection circuits 231S to 235S. Each of the D flip-flops 231 to 235 has a reset terminal R, a set terminal S, a non-inverting terminal Q, and an inverting terminal QB. The D flip-flops 231 to 236 latch the image data D0–D5 at a moment corresponding to the leading edge of the latch pulse TRS.

The D flip-flops 231 to 235 latch a value indicated by the low order bits (D0–D5) of the image data D. The D flip-flop 236 latches a value indicated by the most significant bit MSB of the image data D. Further, the selection circuits 231S to 235S select the non-inverted output signal or the inverted output signals of the D flip-flops 231 to 235 according to output signals of the D flip-flop 236. More specifically, when the data D5 represented by the most significant bit MSB of the image data D is "0", the selection circuits 231S to 235S select the non-inverted output signals of the D flip-flops 231 to 235. In contrast, when the data D5 represented by the most significant bit MSB of the image data D is "1", the selection circuits 231S to 235S select the non-inverted output signals of the D flip-flops 231 to 235.

Further, the aforementioned latch reset signal LRST is supplied to the latch unit UB1 through the AND circuit 247 and 248. The AND circuits 247 and 248 and the inverter 249 constitute the selection circuit. This selection circuit supplies a latch reset signal LRST to the reset terminals R of the D flip-flops when the data D5 indicated by the most significant bit MSB of the image data D is "0". On the other hand, when the data D5 indicated by the most significant bit MSB of the image data D is "1", the selection circuit supplies a latch reset signal LRST to the set terminals S of the D flip-flops 231 to 235.

Next, regarding the switch SW32, this switch is controlled so that the switching state thereof is changed according to the output data value of the D flip-flop 236, that is, according to the data D5 indicated by the most significant bit MSB of the image data. More specifically, the switch SW32 selects the first reset voltage Vb1 corresponding to a white level (namely, the transmittance of about 100%) when the data D5 indicated by the most significant bit MSB is "0", while the switch SW32 selects the second reset voltage Vb2 corresponding to a black level (namely, the transmittance of about 0%) when the data D5 indicated by the most significant bit MSB is "1". That is, the switch SW32 serves as a first selection circuit that has the function of selecting one of the first reset voltage Vb1 and the second reset voltage Vb2 according to the value indicated by the most significant bit MSB of the image data D, and that has the function of outputting the selected voltage as the reset voltage Vr.

Next, regarding the switch SW3, this switch is in an on-state when the control signal SRST has an H level, whereas this switch is in an off-state when the control signal SRST has an L level. Incidentally, the control signal SRST is a signal delayed by one period of clock signals CK. Therefore, after the value indicated by the most significant bit MSB of the image data D is definitely determined, the switch SW3 supplies a reset voltage Vr to the signal lines 6a. In this sense, the switch SW3 functions as the aforementioned first charging portion C1.

Next, regarding the switch SW31, this switch is controlled so that the switching state thereof is changed according to the data D5 indicated by the most significant bit MSB of the image data D, similar to the switch SW32. More specifically, switch SW31 selects the first reference voltage Va1 when the most significant bit MSB of the data D5 is "1", while the switch 31 selects the second reference voltage Va2, when the most significant bit MSB of the data D5 is "0". Namely, the switch SW31 serves as a second selection circuit having the function of selecting one of the first reference voltage Va1 and the second reference voltage Va2 according to the most significant bit MSB of the image data D and also having the function of then outputting the selected voltage as the reference voltage Va.

Meanwhile, the method of determining the reset voltage Vr, the reference voltage Va, and the capacitance ratio a is described hereinbelow. These quantities are determined so that the output characteristics of the DA conversion become close to those illustrated in FIG. 7(A) as much as possible. Thus, first, the voltages respectively corresponding to the maximum transmittance T1 and the minimum transmittance T2 are set as the reset voltage 10 Vr. In this embodiment, the voltages Vb1 and Vb2 are selected as the first reset voltage and the second reset voltage, respectively. Next, the capacitance ratio a and the reference voltage Va are determined so that, when the first and second reset voltages are Vb1 and Vb2, respectively, the output characteristic of the DA conversion becomes close to those of FIG. 7(A) as much as possible. Especially, the reference voltages Va (Va1, Va2) are set so that when the image data D is "100000" or "011111", a gray scale display corresponding to a transmittance of about 50% of the liquid crystal is performed, and that gray scale levels can be set in such a manner as to enable smooth gray scale change between the image data D "100000" and "011111".

Next, the SR flip-flop 243 has a configuration similar to that of the SR flip-flop 244. The SR flip-flop 243 outputs a counter set signal CRST at the output terminal Q. Further, the second reset signal RST2 is supplied to the reset terminal R thereof. The timing generating circuit 300 generates the second reset signal RST2 according to the clock signal CK. The signal level of the second reset signal RST2 changes from an L level to an H level. Therefore, a time period, during which the level of the counter reset signal CRST is an L level occurs a time period, during which the level of the control signal SRST is an H level.

Next, the OR circuit 245 calculates the logical OR of the counter reset signal CRST and the clock signal CK.

The aforementioned charging portion C2 is constituted by the switch SW1, the switch SW2, and the internal capacitance CD. The switch SW1 is configured so that the on/off thereof is controlled according to the output signal of the OR circuit 245. On the other hand, the on/off of the switch SW2 is controlled according to a signal obtained by inverting the level of the output signal of the circuit 245 by means of the inverter 246. Thus, when the switch SW1 is in an on-state, the switch SW2 is in an off-state. Conversely, when the switch SW1 is in an off-state, the switch SW2 is in the on-state. Incidentally, an output signal of the OR circuit 245 and an output signal of the inverter 246 serve as control signals for controlling the charging of the second charging portion C2 and the transfer of charges. Furthermore, a circuit consisting of the SR flip-flop 243 and the OR circuit 245, and the inverter 246 serve as a control signal generating circuit for generating various control signals according to the output signal X of the comparator 242.

First, in the unit configured as described above, when the switch SW1 is turned on (namely, the signal level of the clock signal CK is an H level), the voltage selected by the switch SW31 is charged into the internal capacitance CD. Subsequently, when the switch SW2 is turned on (namely, the signal level of the clock signal CK is an L level), the charge charged in the internal capacitance CD is transferred to the signal line 6a. Thence, the charging and discharging of the internal capacitance CD are repeated in a time period during which the signal level of the counter reset signal CRST is an L level. As described above, the time period during which the signal level of the counter reset signal CRST is an L level, corresponds to the value indicated by 5 low order bits of the image data D. Thus, the number of times for charging and discharging of the internal capacitance CD corresponds to the value indicated by the five low order bits of the image data.

1-5-3. Operation of DA Converter

Figure 9:
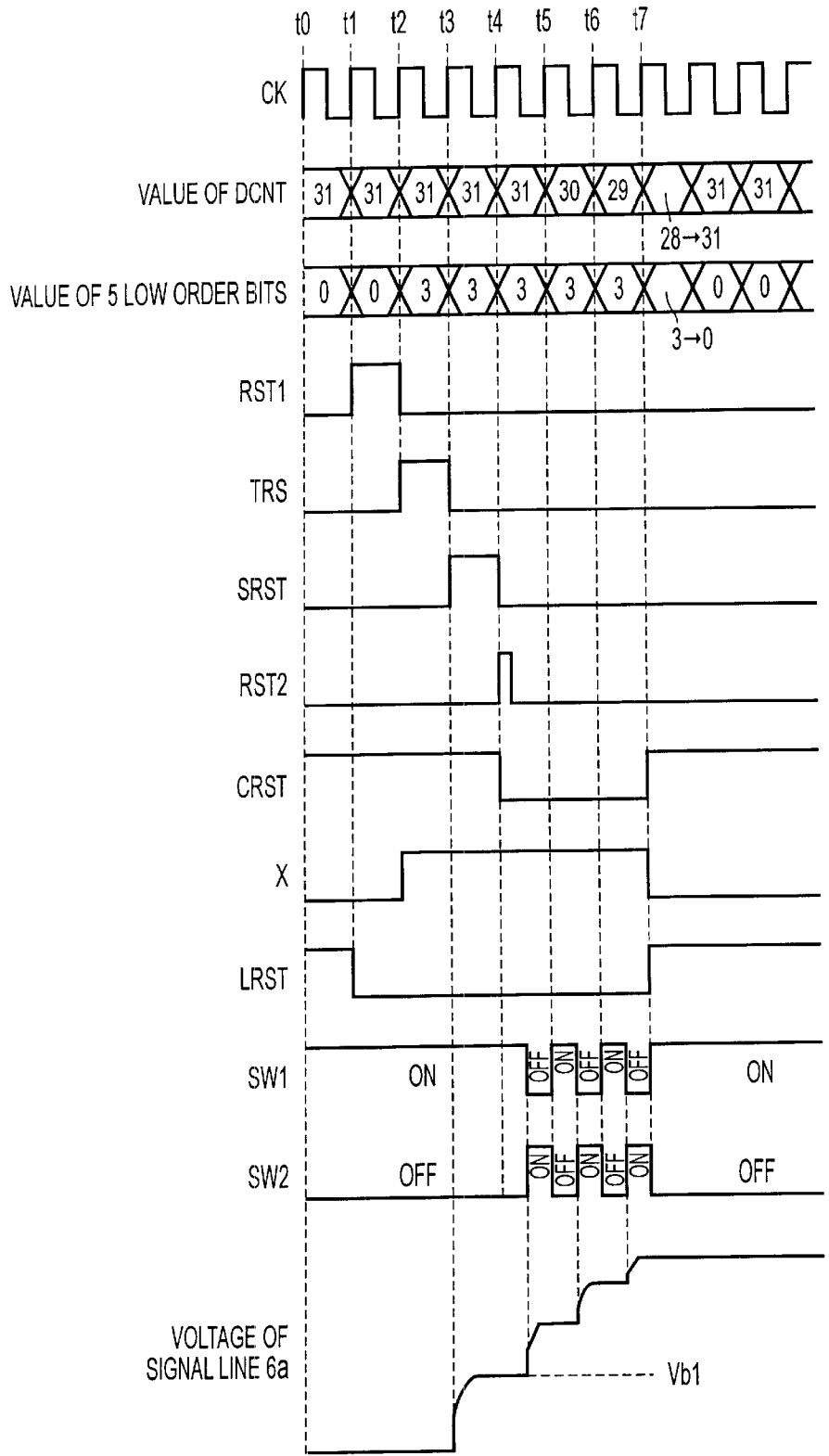
FIG. 9 is a timing chart illustrating an operation of a DA converter portion 240 in the case that image data D is "000011"

Next, an operation of the DA converter 240 will be described. Incidentally, it is assumed that a value indicated by data D0–D5 respectively corresponding to the bits of the image data is "000011" in this embodiment. FIG. 9 is a timing chart for illustrating an operation of the DA converter 240. Incidentally, although omitted in FIG. 9 for the convenience of description, the first reset signal RST1, the latch pulse signal TRS, the control signal SRST, and the second reset signal RST2 are signals, the period of each of which is one horizontal scanning period.

First, when the signal level of the first reset signal RST1 changes from an L level to an H level to a moment t1, the level of the voltage at the output terminal Q of the SR flip-flop 244 is changed to an L level. Thus, at the moment t1, the logical level of the latch reset signal LRST changes from an H level to an L level. In this embodiment, the data D5 indicated by the most significant bit MSB of the image data D is "0", the latch reset signal LRST is supplied to each of the reset terminals R of the flip-flops 231 to 235. Therefore, the D flip-flops 231 to 235 are changed into a ready state for latching at the moment t1.

Subsequently, when the signal level of the latch pulse TRS changes from an L level to an H level at a moment t2, the latch unit UB1 latches the image data D with this timing. Because the data D5 indicated by the most significant bit MSB of the image data D is "0", each of the selection circuits 231S to 235S of the latch unit UB1 selects an non-inverted output signal of a corresponding one of the D flip-flops 231 to 235. Thus, a value indicated by 5 low order bits of the image data D outputted from the latch unit UB1 is "3" (namely, "00011") at the moment t2. At that time, the comparator 242 compares a value "15" (namely, "11111"), which is indicated by the count data DCNT, with the value "3" (namely, "00011"), which is represented by the five low order bits of the image data D, and outputs an output signal X whose signal level is an H level.

Next, when the signal level of the control signal SRST changes from an L level to an H level at a moment t3, the state of the switch SW3 is changed from an off-state to an on-state. In this embodiment, the data D5 indicated by the most significant bit MSB of the image data D is "0". Thus, during the signal level of the control signal SRST is an H level, the first reset voltage Vb1 corresponding to a white level is applied to the signal line 6a. As a result, the first reset voltage Vb1 is charged into the parasitic capacitance CS of the signal line 6a. Further, at a moment t4, the signal level of the control signal SRST changes from an H level to an L level. Then, the charging of the first reset voltage Vb1 is finished. Incidentally, the output impedance of a power supply circuit for supplying the first reset voltage Vb1 is set at a sufficiently low level. Thus, as illustrated in FIG. 9, in the case that the charging is started at the moment t3, the value of the voltage of the signal line 6a reaches a value of Vb2 until the moment t4.

Next, when the signal level of the second reset signal RST2 changes from an L level to an H level at the moment t4, the level of the voltage at the output terminal Q of the SR flip-flop 243 is changed to an L level. Thus, when the signal level of the counter reset signal CRST changes from an H level to an L level, the down-counter 241 enters an operation-ready state for counting. Meanwhile, the counter reset signal CRST is generated according to the second reset signal RST2. Further, the second reset signal RST2 is produced according to the clock signal CK. Therefore, a change in the signal level of the counter reset signal CRST from an H level to an L level lags a little behind a change in the signal level of the clock signal CK from an L level to an H level. Thus, the down-counter 241 does not count the clock signal CK at the moment t4. Hence, as illustrated in FIG. 9, the value indicated by the count data DCNT between the moments t4 and t5 is "31".

Further, the counter 241 operates between the moment t4 to a moment t7 as follows. The counter 241 does not count the clock signal CK until the moment t4. Thus, the value indicated by the count data DCNT is "31" (namely, "11111"). The values indicated by the count data DCNT at moments t5, t6, and t7 are "30" (namely, "11110"), "29" (namely, "11101"), and "28" (namely, "11100"), respectively.

Thus, when the value represented by the count data DCNT reaches "28" (namely, "11100") at the moment t7, the signal level of the output signal X of the comparator 242 changes from an H level to an L level. Then, the level of the voltage at the output terminal Q of the SR flip-flop 243 becomes an H level. Thus, the signal level of the counter reset signal CRST changes from an L level to an H level. As described above, at the moment t4, the signal level of the counter reset signal CRST changes from an H level to an L level. Therefore, in a time period between the moments t4 and t7, the signal level of the counter reset signal CRST changes to an L level. Namely, the signal level of the counter reset signal CRST is an L level during clock periods of the number that is equal to a value "3" represented by the five low order bits of the image data D.

Incidentally, whether the switch SW1 is in an on-state or an off-state is controlled according to an output signal of the OR circuit 245. On the other hand, whether the switch SW2 is in an on-state or an off-state is controlled according to an output signal of the inverter 246. Therefore, as illustrated in the figure, the switches SW1 and SW2 are alternately and repeatedly turned on and off in a time period between the moments t4 and t7. Further, when the switch SW1 is in an on-state, the voltage Va1 is charged into the internal capacitance CD. When the switch SW2 is in an on-state, charges charged in the internal capacitance CD is transferred to the signal line 6a. The number of times for charging and discharging of the internal capacitance CD is 3. Thus, the charging and discharging thereof are performed a number of times which is equal to a value indicated by the five low order bits of the image data D.

Figure 10:
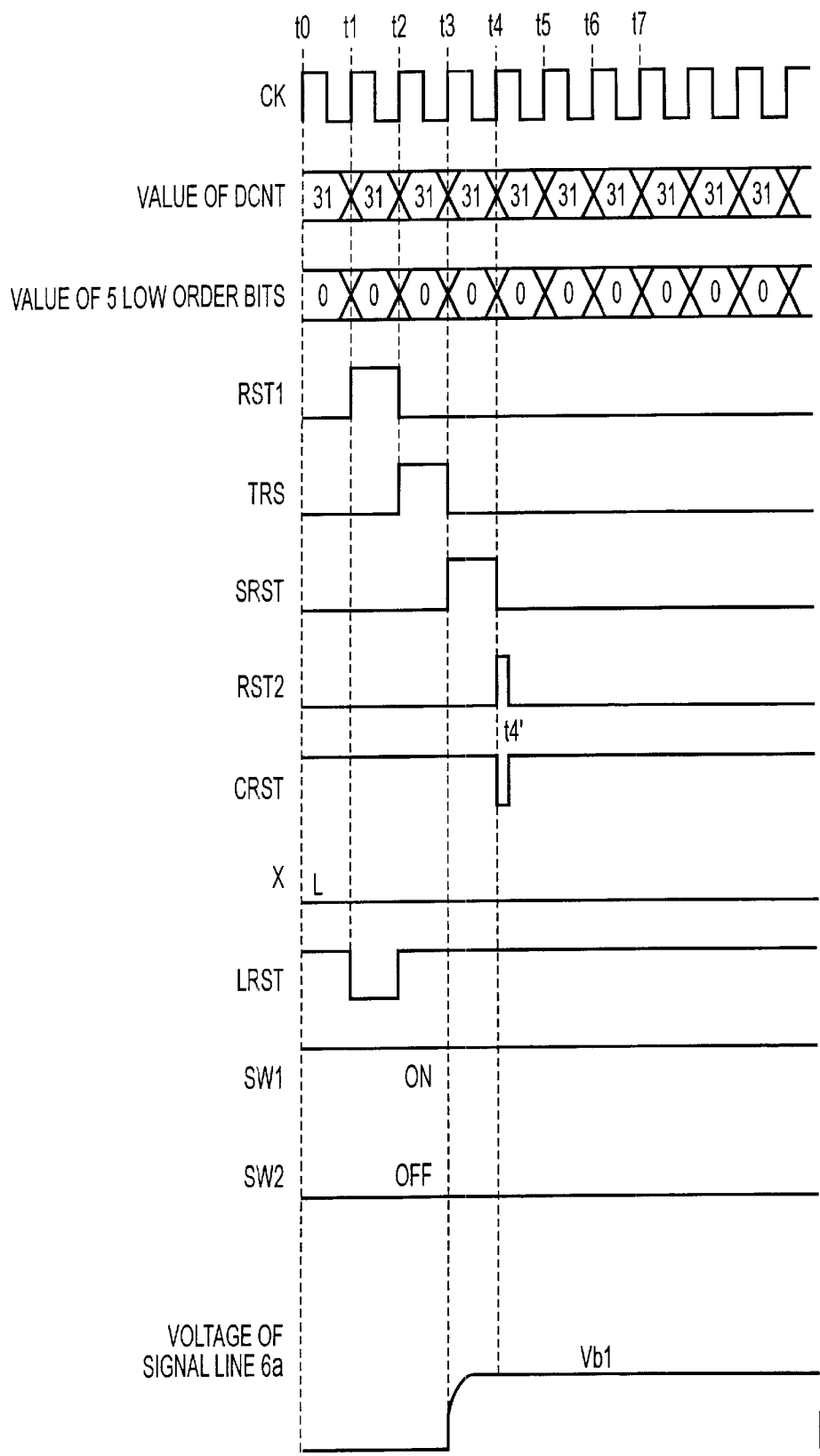
FIG. 10 is a timing chart illustrating an operation of the DA converter portion 240 in the case that the image data D is "000000"

Next, it is assumed that the image data D is "000000". FIG. 10 is a timing chart for illustrating an operation of the DA converter portion 240 in the case that the image data D is "000000".

In this case, in a time period between the moments t3 and t4, the signal level of the control signal SRST changes to an H level, so that the switch SW3 is turned on. Further, in this time period, the first reset voltage Vb1 is supplied to the signal line 6a. The parasitic capacitance CS is charged to the first reset voltage Vb1.

Next, when the signal level of the counter reset signal CRST falls from an H level to an L level at the moment t4, the counter 241 is put into a ready state for counting. At the moment t4, the value indicated by the counter DCNT is "15" (namely, "11111"). Further, the value indicated by the five low order bits of the image data to be supplied to the comparator 242 is "0" (namely, "00000"). Thus, the signal level of an output signal X of the comparator 242 remains at an L level. Therefore, when the signal level of the second reset signal RST2 changes from an L level to an H level at the moment t4', the signal level of the counter reset signal CRST changes from an H level to an L level. Thus, the switch SW1 remains in an on-state while the switch SW2 remains in an off-state. Consequently, the transfer of charges from the internal capacitance CD to the parasitic capacitance CS does not occur. In other words, a DA conversion operation is finished by performing only the first step of FIG. 4. As a result, the voltage of the signal line 6a starts rising at the moment t3, and reaches the first reset voltage Vb1 before the moment t4, as illustrated in FIG. 10. Thus, the transmittance of the liquid crystal of the pixel comes to have the highest value.

Figure 11:
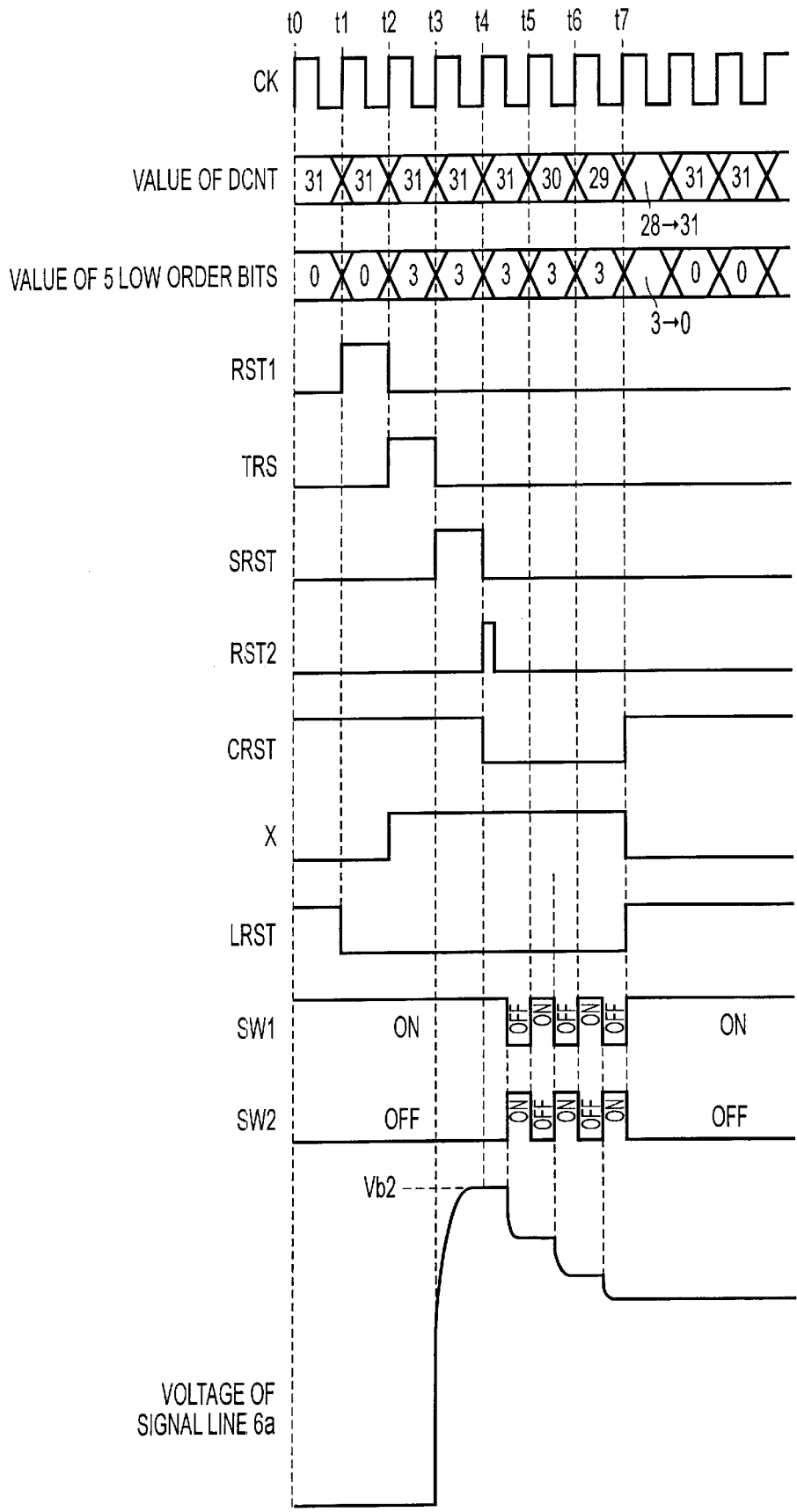
FIG. 11 is a timing chart illustrating an operation of the DA converter portion 240 in the case that the image data D is "111100"

Next, it is assumed that the image data D is "111100". FIG. 11 is a timing chart for illustrating an operation of the DA converter portion 240 in the case that the image data D is "111100".

When the signal level of the latch pulse TRS changes from an L level to an H level at the moment t2 shown in FIG. 11, the latch unit UB1 latches the image data D with this timing. The data D5 indicated by the most significant bit MSB of the image data D is "1". Thus, each of the selection circuits 231S to 235S of the latch unit UB1 selects a corresponding one of inverted output signals of the D flip-flops 231 to 235. Therefore, at the moment t2, the value indicated by the five low order bits of the image data D outputted by the latch unit UB1 is "3" (namely, "00011").

At that moment, the comparator 242 compares the value "15" (namely, "11111"), which is indicated by the count data DCNT, with the value "3" (namely, "00011") indicated by the five low order bits of the image data D. In this case, the output signal X of the comparator 242 has an H level.

Next, when the signal level of the control signal SRST changes from an L level to an H level at the moment t3, the state of the switch SW3 changes from an off-state to an on-state. In this embodiment, the data D5 represented by the most significant bit MSB of the image data D is "1". Thus, the second reset voltage Vb2 corresponding to a black level is applied to the signal line 6a. As a result, the second reset voltage Vb2 is charged into the parasitic capacitance CS of the signal line 6a. Further, at the moment t4, the control signal SRST changes from an H level to an L level. Consequently, the supply of the second reset voltage Vb2 is terminated.

Next, in a time period between the moments t4 and t7, the switches SW1 and SW2 are alternately and repeatedly turned on and off. Consequently, the charges charged in the parasitic capacitance CS is transferred to the internal capacitance CD. The number of times for charging and discharging of the internal capacitance CD is 3. Thus, the second charging portion C2 performs charging and discharging a number of times which corresponds to a value indicated by the five low order bits of the image data D.

Figure 12:
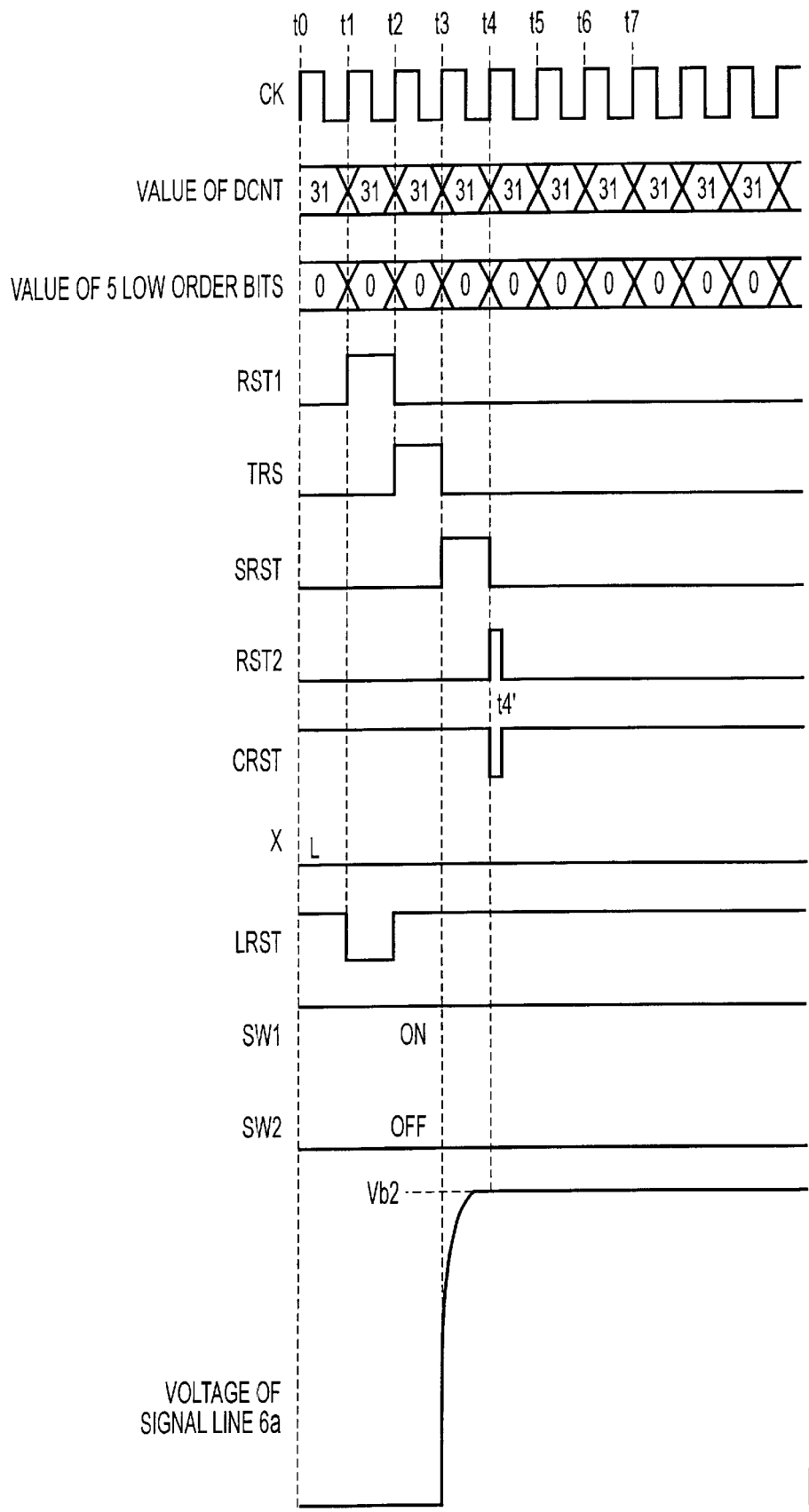
FIG. 12 is a timing chart illustrating an operation of the DA converter portion 240 in the case that the image data D is "111111"

Next, it is assumed that the image data D is "111111". FIG. 12 is a timing chart for illustrating an operation of the DA converter portion 240 in the case that the image data D is "111111". In this case, in a time period between the moments t3 and t4, the switch SW3 is turned on. Further, in this time period, the second reset voltage Vb2 is supplied to the signal line 6a. The parasitic capacitance CS is charged to the second reset voltage Vb2.

Moreover, in the case of this example, similar to the case that the image data D is "000000", the switch SW1 remains in an on-state while the switch SW2 remains in an off-state. Thus, the transfer of charge from the parasitic capacitance CS to the internal capacitance CD does not occur. Therefore, the voltage of the signal line 6a changes to the second reset voltage Vb2 at which the transmittance is almost 0%.

Next, in the case that the image data D is "011111", the data DS indicated by the most significant bit MSB thereof is "0", so that the switch SW31 selects the first reset voltage Vb1. Thus, the parasitic capacitance CS of the signal line 6a is charged to the first reset voltage Vb1. Further, data indicated by five bits other than the most significant bit of the image data D is "11111". Thus, the number of clock pulses CK contained in the time period during which the signal level of the counter reset signal CRST is an L level is 31. Therefore, the charging and discharging are performed 31 times by using the internal capacitance CD.

Figure 13:
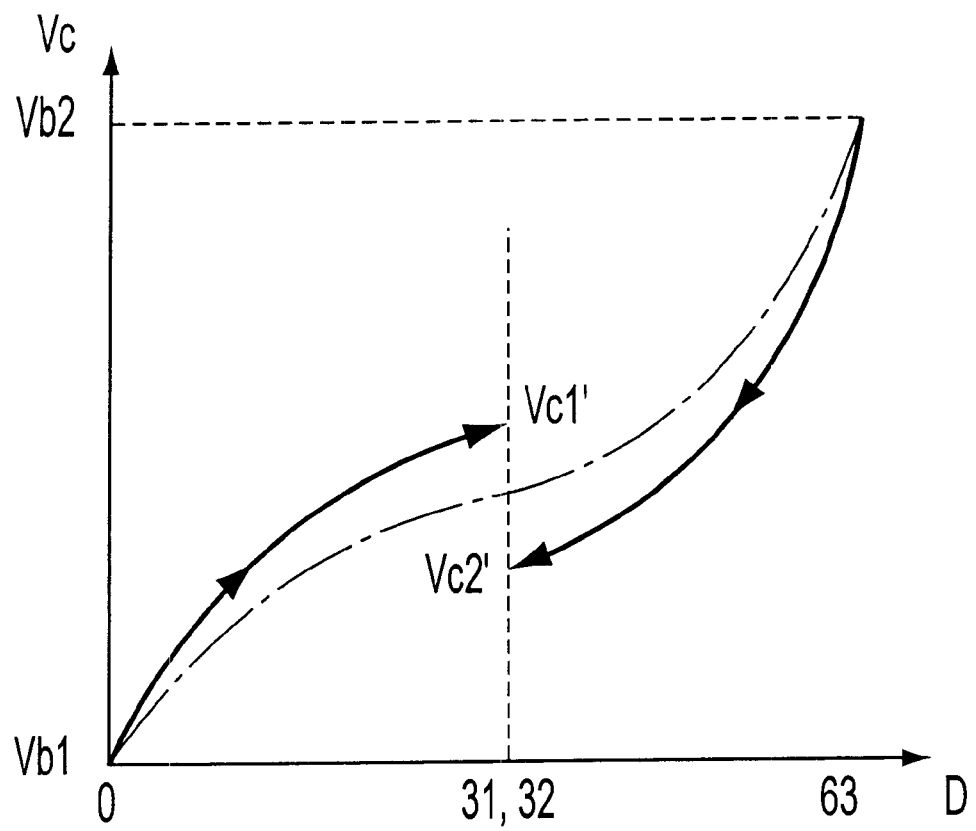
FIG. 13 is a graph illustrating the relation between the voltage of a signal line and image data.

Meanwhile, if the reference voltage Va is set without taking the output characteristics of FIG. 7(A) into consideration, the voltage Vc of the signal line 6a is represented by a discontinuous curve, as indicated by, for example, a solid line in FIG. 13. However, in this example, a described above, the first reference voltage Va1 and the second reference voltage Va2 are set so that when the image data D is "100000" or "011111", a gray scale display corresponding to a transmittance of about 50% of the liquid crystal is performed, and that gray scale levels can be set in such a manner as to enable smooth gray scale change between the image data D "100000" and "011111". Therefore, as shown in FIG. 13, the voltage Vc of the signal line 6a is represented by a smooth curve that is indicated by a one-dot chain line.

As described above, in the case of the DA converter portion 240, a DA conversion is performed by using one internal capacitance correspondingly to each of the signal lines 6a. Thus, as compared with the capacitance-distributed type DA conversion circuit, the number of the internal capacitances can be considerably decreased.

Furthermore, the voltage Vs of the signal line 6a can be exponentially increased or decreased by performing charging and discharging so as to transfer charges between the internal capacitance CD and the parasitic capacitance CS of the signal line 6a. Additionally, the DA converter portion 240 selects the reset voltage of the signal line 6a according to the data DS indicated by the most significant bit MSB of the image data. Moreover, the number of times N for charging and discharging operations to be performed is determined according to the value indicated by the other bits of the image data. Thus, the DA converter portion 240 can perform a DA conversion by simultaneously performing a γ correction according to the transmittance characteristics of the liquid crystal. This eliminates the necessity for providing a γ correction circuit at the preceding stage of the signal line driving circuit. Consequently, the circuit configuration of the entire liquid crystal display device can be considerably simplified. As a result, the area occupied by the DA converter portion 240 or the signal line driving circuit including this portion can be greatly decreased, as compared with that in the case of the signal line driving circuit employing the conventional capacitance-distributed type DA conversion circuit or the conventional DA conversion circuit that uses an operational amplifier.

1-6. Modifications of First Embodiment 1-6-1: Alteration of First Reset Voltage Vr1 and Second Reset Voltage Vr2

The brightness (or transmittance) of the pixel can be increased by shifting the first reset voltage Vr1 and the second reset voltage Vr2 of the first embodiment in a positive direction by the same value. Conversely, the brightness or transmittance of the pixel can be decreased by shifting the reset voltages Vr1 and Vr2 in a negative direction. Moreover, the contrast ratio can be increased by preliminarily setting the difference (Vr1−Vr2) between these reset voltages at a large value. Conversely, the contrast ratio can be decreased by preliminarily setting such a difference at a small value. Thus, it is preferable that a variable voltage generating circuit is provided in the power supply circuit 400 to thereby enable the adjustment of the first reset voltage Vr1 and the second reset voltage Vr2.

1-6-2: AC Driving

In the foregoing description, there has been described the embodiment in which the first reference voltage Va1, the second reference voltage Va2, the first reset voltage Vr1, and the second reset voltage Vr2 are of positive polarity. However, actual liquid 20 crystal display devices perform AC driving of liquid crystals of pixels so as to prevent deterioration of the liquid crystals. It is, thus, necessary for the DA converter portion 240 to output a voltage of negative polarity with reference to a common voltage Vcom to the signal lines 6a, and to apply a voltage of negative polarity to the liquid crystals of the pixels. Namely, the DA converter portion 240 should output a voltage to the signal lines 6a according to the cycle of the AC driving by switching the polarity of the voltage between positive and negative polarities.

Thus, preferably, the power supply circuit 400 has a positive polarity power supply circuit for generating voltages of positive polarity, a negative polarity power supply circuit for generating voltages of negative polarity, and a selection circuit for selecting one of outputs of the positive polarity power supply circuit and the negative polarity power supply circuit according to the cycle of the AC driving. In this case, the selected reference voltage Va, and the selected reset voltages Vb1 and Vb2 are supplied to the DA converter portion 240.

The cycles of switching the first reference voltage Va1, the second reference voltage Va2, the first reset voltage Vr1, and the second reset voltage Vr2 are set, for example, in the following manners. That is, in a first manner, the polarity of the applied voltage is changed every vertical scanning period. This is a driving method according to which the polarity of the voltage applied to the liquid crystals is changed every vertical scanning period (namely, 1 field or 1 frame). In a second manner, the polarity of the applied voltage is changed every horizontal scanning period.

Furthermore, in another manner, the inversion (namely, what is called a source line inversion) of the polarity of the voltage applied to the liquid crystals is performed every column or line of pixels. In another manner (namely, what is called a dot inversion driving manner), the inversion of the polarity of the voltage applied to the liquid crystals is performed every pixel.

In these cases, it is necessary that each of the voltages Va1, Va2, Vr1, and Vr2 is set in such a way as to alternately have different polarity between each pair of adjoining DA units. To this end, the power supply circuit 400 has the negative polarity power supply circuit and the positive polarity power supply circuit, and supplies outputs of these polarity supply circuits to the DA converter portion 240. Further, a selection circuit for selecting one of a voltage of positive polarity and a voltage of negative polarity according to a polarity switching cycle is provided in each of the DA units. This switching cycle is a vertical scanning period in the case of what is called the source line inversion, and is a horizontal scanning period in the case of what is called the dot inversion.

1-6-3: Relation between Image Data and White or Black Level

In the foregoing description, it has been described that in the first embodiment, the image data "111111" corresponds to a black level, and the image data "000000" corresponds to a white level. However, the image data "111111" and "000000" may correspond to the white level and the black level, respectively. Moreover, the setting of the alignment direction and the polarization axis may be changed (to that as in the case of a normally black mode) in the first embodiment. Needless to say, similar to the case of the first embodiment, the present invention may be applied to the case that a low output voltage of the DA converter corresponds to a low transmittance, and that a high output voltage of the DA converter corresponds to a high transmittance.

1-6-4. Alteration of 1st Reference Voltage Va1 and 2nd Reference Voltage Va2

The first reference voltage Va1 and the second reference voltage Va2 to be supplied and applied are set so that when data "011111" or "011111" is inputted as the image data D, the voltage Vc of the signal line 6a is an intermediate voltage between the first reset voltage Vb1 and the second reset voltage Vb2, and that the gray scale levels are set in such a manner as to enable smooth gray scale change between the image data D "100000" and "011111".

However, the curves illustrated in FIGS. 5 and 6 showing the characteristics of the 1-bit DA converter are dependent upon the value Cd of the internal capacitance and the value Cs of the parasitic capacitance, and vary when these values Cd and Cs change. Now, let Vc1 and Vc2 respectively denote a voltage obtained when the image data "011111" is inputted into an actual liquid crystal display device, and a voltage obtained when the image data "100000" is inputted thereinto. These voltages Vc1 and Vc2 may deviate from ideal values thereof. There is a fear that the curves representing the voltages Vc1' and Vc2' do not show smooth gray scale change, as illustrated in, for instance, FIG. 13. At worst, the relation between the gray scale levels corresponding to the voltages Vc1' and Vc2' may be inverted.

Thus, preferably, a variable constant voltage circuit 400*a* is provided in the power supply circuit 400 and generates the first reference voltage Va1 and the second reference voltage Va2 (see FIG. 1). In this case, the first reference voltage Va1 and the second reference voltage Va2 are adjusted by performing a process consisting of the following steps.

In a first step, after a liquid crystal panel is manufactured, a driving circuit is operated by inputting image data thereto. In a second step, the voltage Vc of the signal lines 6*a* and the amount of light transmitted by the pixels are measured. In a third step, a reference voltage Va, which is the most suitable voltage for equalizing the voltages Vc1 and Vc2 respectively to correspond to the image data "011111" and "100000" with each other, is determined according to a result of the measurement. At a fourth step, the voltage generated by the variable constant voltage circuit 400*a* is adjusted in such a way as to be able to obtain such a reference voltage Va. Thus, the gray scale can be controlled in such a way as to smoothly change. Thus, this process is advantageous in that high picture quality is obtained.

Meanwhile, a wiring is provided so that the first reference voltage Va1 and the second reference voltage Va2 are supplied from the power supply circuit 400 to the DA units respectively corresponding to the signal lines 6*a*. When this modification is applied, it is necessary to fully take into consideration a delay caused in the wiring. This delay should not prevent the internal capacitance CS from being sufficiently charged. Thus, preferably, contrivances are made to reduce the parasitic resistance and capacitance of the wiring.

1-6-5: Alteration of Second Charging Portion

In the aforementioned embodiment, the DA unit UC1 illustrated in FIG. 8 has switches SW1 and SW2 connected to the internal capacitance CD, and complementarily turned on and off, and a second charging portion C2 for alternately performing the charging and the discharging thereof.

Figure 14:
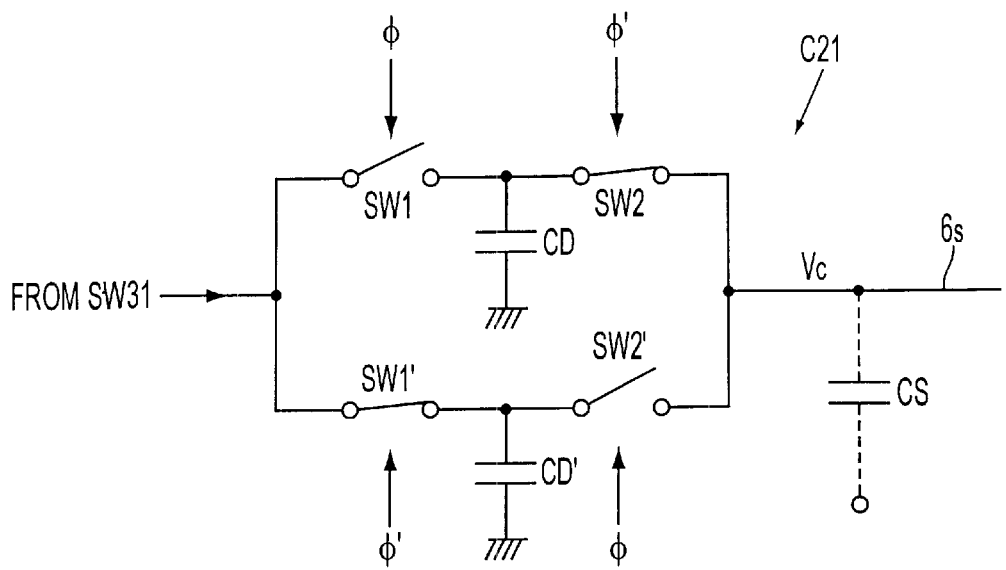
FIG. 14 is a block diagram illustrating the configuration of a first example of the improvement of a second charging portion C2.

FIG. 14 is a block diagram illustrating the constitution of a first example of the improvement of the second charging portion C2. This second charging portion C21 is constituted by having two sets of switched capacitor circuits, each of which consists of one internal capacitance and two switches. Further, a clock signal $\phi$ is supplied to switches SW1 and SW2', while a clock signal $\phi'$ obtained by inverting the clock signal $\phi$ is supplied to switches SW2 and SW1'. Further, it is assumed that the value of the internal capacitance CD is equal to the value of the internal capacitance CD'.

Thus, when the internal capacitance CD is charged, the internal capacitance CD' is discharged. Conversely, when the internal capacitance CD is discharged, the internal capacitance CD' is charged. Thus, the second charging portion C21 can nearly double the operation speed of a DA conversion, as compared with that in the case of employing the second charging portion C2 illustrated in FIG. 8.

Figure 15:
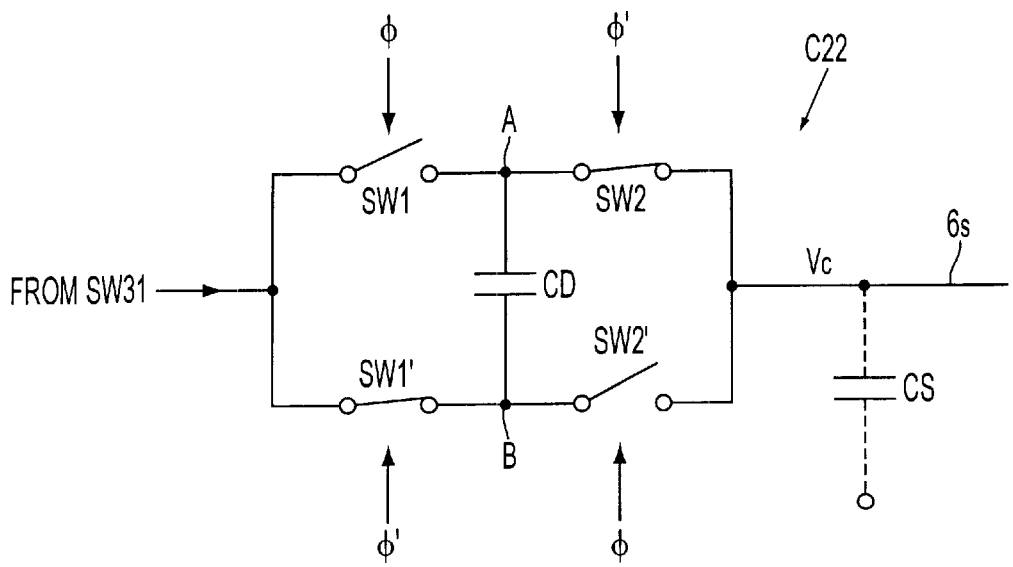
FIG. 15 is a block diagram illustrating the configuration of a second example of the improvement of the second charging portion C2.

Incidentally, the first example of FIG. 14 requires the two sets of the switched capacitor circuits, so that the area occupied by the circuit increases. Then, a second example of the improvement of the second charging portion is devised, as illustrated in FIG. 15. In the second charging portion C22, the connecting terminals A and B are connected to the connecting point between switches SW1 and SW2 and the connecting point between switches SW1' and SW2', respectively. Therefore, in the case that switches SW2 and SW1' are in an on-state and that switches SW1 and SW2' are in an off-state, the connecting terminal A is connected to the signal line 6*a*, while the connecting terminal B is connected to a switch SW31. On the other hand, in the case that the switches SW1 and SW2' are in an on-state, and that the switches SW2 and SW1' are in an off-state, the connecting terminal B is connected to the signal line 6*a*, and the connecting terminal A is connected to the switch SW31. Thus, in each clock cycle, the connecting state is changed twice. The parasitic capacitance CS is charged each time when the connecting state is switched. As a result, the second charging portion C22 can double the operation speed of a DA conversion, as compared with that in the case of employing the second charging portion C2 illustrated in FIG. 8. Moreover, the number of the internal capacitances can be reduced, as compared with that in the case of employing the second charging portion 21.

It is now assumed that the value Cd of the internal capacitance is set in such a manner as to be, for example, (1/19) of the value of the parasitic capacitance Cs, that the first reset voltage Vr1 and the second reset voltage Vr2 are set at, for instance, 5 V and 0 V, respectively, and that the first reference voltage Va1 and the second reference voltage Va2 are set at, for example, 1.9 V and 2.1 V, respectively. In this case, the voltage Vc1 corresponding to the image data "100000", and the voltage Vc2, corresponding to the image data "011111" provide smooth gray scale. Consequently, a transmittance variation range T can be uniformly divided into 64 gray scale levels.

Now, the charging voltage of the parasitic capacitance CS obtained by the operation of the second charging portion C22 will be described hereunder. In this example, one time for charging and discharging means that the switching between the on-state and the off-state occurs one time. Let Va designate an output voltage of the switch SW31. Further, let Vc(N) denote the charging voltage (namely, the voltage of the signal line) of the parasitic capacitance CS. Then, the voltage Vc(N) is given by:

$N=0$: $Vc(0)=Vr$, $N=1$: $Vc(1)=\{Cd/(Cs+Cd)\}(2Va-Vr)+Vr$ $N=2$: $Vc(2)=\{Cd/(Cs+Cd)\}(2Va-Vc(1))+Vc(1)$

...

$N=n$: $Vc(n)=\{Cd/(Cs+Cd)\}(2Va-Vc(n-1))+Vc(n-1)$

Incidentally, let $\alpha$ designate the capacitance ratio of the value of the internal capacitance Cd to the value of the parasitic capacitance Cs (namely, $\alpha=Cd/Cs$). Then, the voltage Vc(N) is given by the following equation (2):

$$Vc(N)=\{\alpha/(1+\alpha)\}(2Va-Vc(n-1))+Vc(n-1) \qquad (2)$$

As is apparent from the equation (2), the charging voltage Vc is determined by Va, Vr and $\alpha$.

Figure 16:
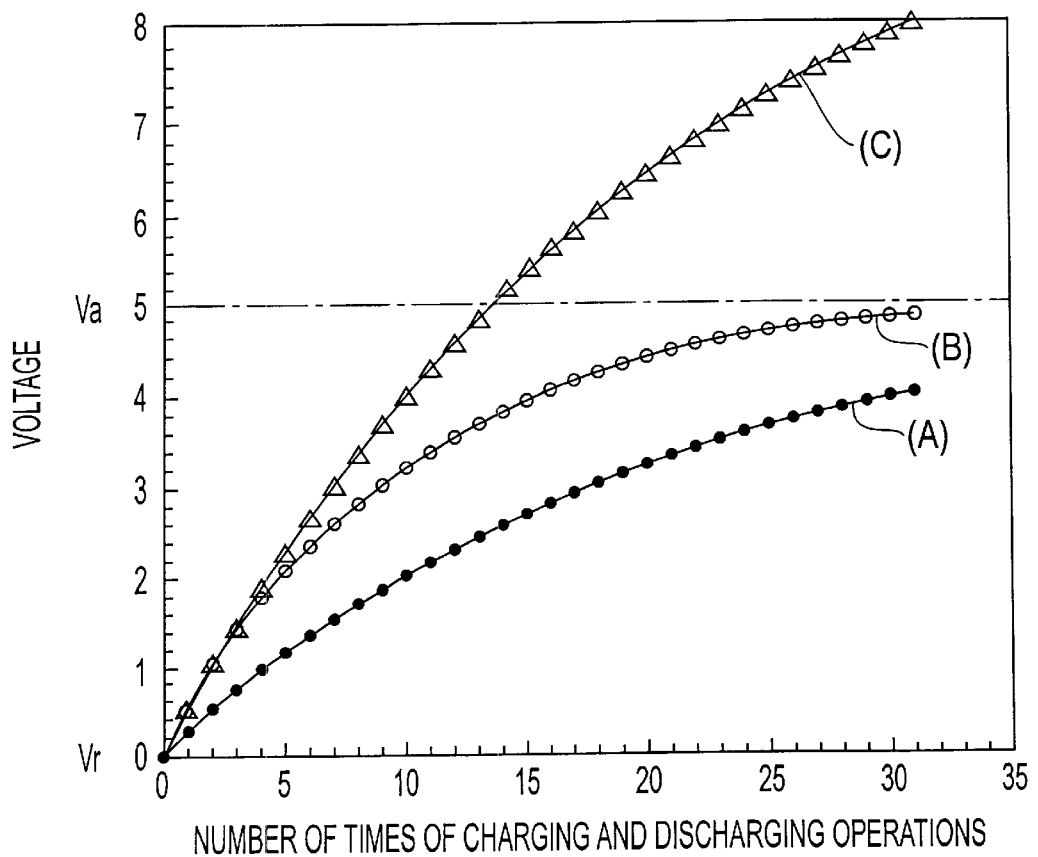
FIG. 16 is a graph illustrating output characteristics of the first and second examples thereof.

Next, the output characteristics of the first example (C21) and the second example (C22) of the second charging portion are evaluated hereinbelow. FIG. 16 is a graph showing the output characteristics of the first example (C21) and the second example (C22) of the second charging portion. Incidentally, in this evaluation, the output characteristics were measured by assuming that the reset voltage Vr is 0 V, and that Cd/Cs=1/19. In FIG. 16, the curve (A) represents the output characteristics of the first example in the case that the reference voltage Va is 5V. The curve (B)

represents the output characteristics of the second example in the case that the reference voltage Va is 5V. Moreover, the curve (C) represents the output characteristics of the first example in the case that the reference voltage Va is 10V.

As is seen from FIG. 16, the curve (B) representing the output characteristics of the second example is closer to the reference voltage Va than the curve (A) representing the output characteristics of the first example at a low gray scale level (namely, a small number of times of the charging and discharging). Therefore, the second example of the second charging portion can raise the voltage of the signal line 6a at a smaller number of times for charging and discharging, as compared with the first example thereof. Moreover, as is apparent from the comparison between the curves (B) and (C), both of these curves are almost in agreement with each other in a region of low gray scale levels (namely, a small number of times for charging and discharging). This means that the second example of the second charging portion has an effect equivalent to that obtained by increasing the reference voltage Va in the first example thereof at a low gray scale level (namely, a small number of times for charging and discharging). Thus, the second example of the second charging portion is effective when applied to a driving circuit in which the number of times of charging and discharging is small (namely, a small number of input image data bits).

Furthermore, as is apparent from the comparison between the curves (B) and (A), the second example of the second charging portion has an advantage in that the curvature of a γ correction curve can be increased. In other words, in the case that an image is displayed according to the same γ correction curve, the capacitance ratio α (=Cd/Cs) can be decreased still further.

Incidentally, in the case of the second example of the second charging portion, the value Cd of the internal capacitance is set in such a way as to be (1/19) the value Cs of the parasitic capacitance. However, there is a demand for decreasing the area occupied by the internal capacitance CS by reducing the value of the internal capacitance Cd. When the capacitance ratio α is decreased, the characteristic curve of the DA converter becomes close to a straight line, so that an amount of a γ correction is small.

Figure 17:
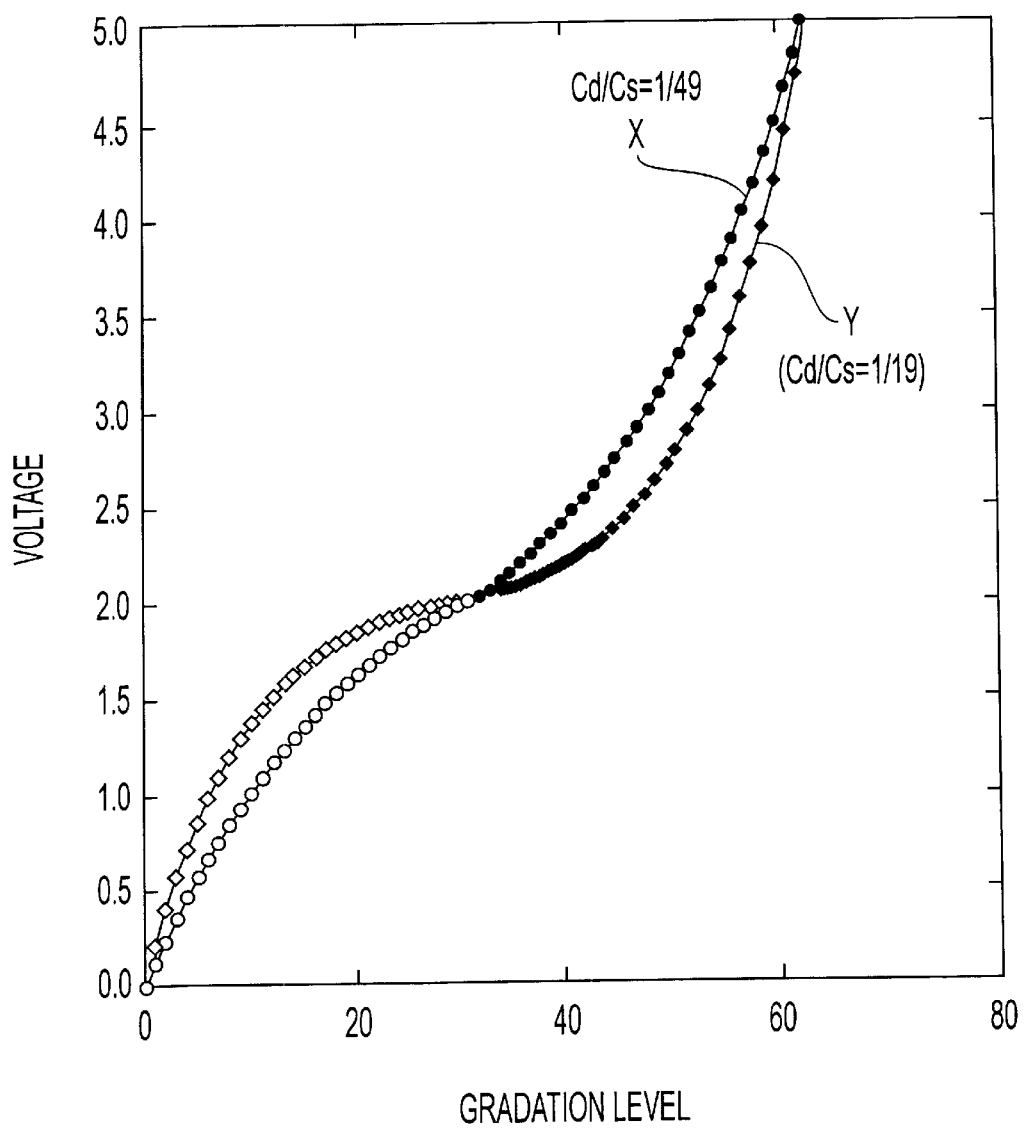
FIG. 17 is a graph illustrating the output characteristic curve X of the second example thereof and the output characteristic curve Y of the DA converter of FIG. 8.

FIG. 17 is a graph showing the output characteristic curve X of the second example of the second charging portion and the output characteristic curve Y of the DA converter of FIG. 8. Incidentally, the output characteristic curve X is obtained by setting the capacitance ratio α at (1/49) in the second example of the second charging portion. The output characteristic curve Y is obtained by setting the capacitance ratio α at (1/19) in the DA converter of FIG. 8. It is understood from the comparison between the curves X and Y in FIG. 17, the output characteristic curve X is closer to a straight line, as compared with the output characteristic curve Y. Thus, the amount of a γ correction in the case of the curve X is smaller than that of a γ correction in the case of the curve Y. Thus, preferably, the capacitance ratio a is not very small. Therefore, the capacitance ratio (1/19) of the second example of the second charging portion is a suitable value.

2. Second Embodiment

Next, the second embodiment of the present invention will be described hereinbelow. In the DA converter portion 240 of the first embodiment, two sets of the reset voltage Vr and the reference voltage Va are prepared. Then, when the γ correction is performed, a DA conversion is performed by selecting these voltages according to the data D5 indicated by the most significant bit MSB of the image data D. The γ correction characteristic of the DA converter portion 240 of the first embodiment is determined according to the equation (1). Thus, practically sufficient γ correction is achieved, as described above. However, it is desirable for enhancing the picture quality of a displayed image still further that the γ correction characteristic is closer to the transmission characteristics of the liquid crystal. The second embodiment of the present invention was created in view of this respect.

2-1. Configuration of Entire Liquid Crystal Display Device

A liquid crystal display device according to the second embodiment has a configuration similar to that of the liquid crystal display device according to the first embodiment except the detailed construction of a signal line driving circuit 200.

Figure 18:
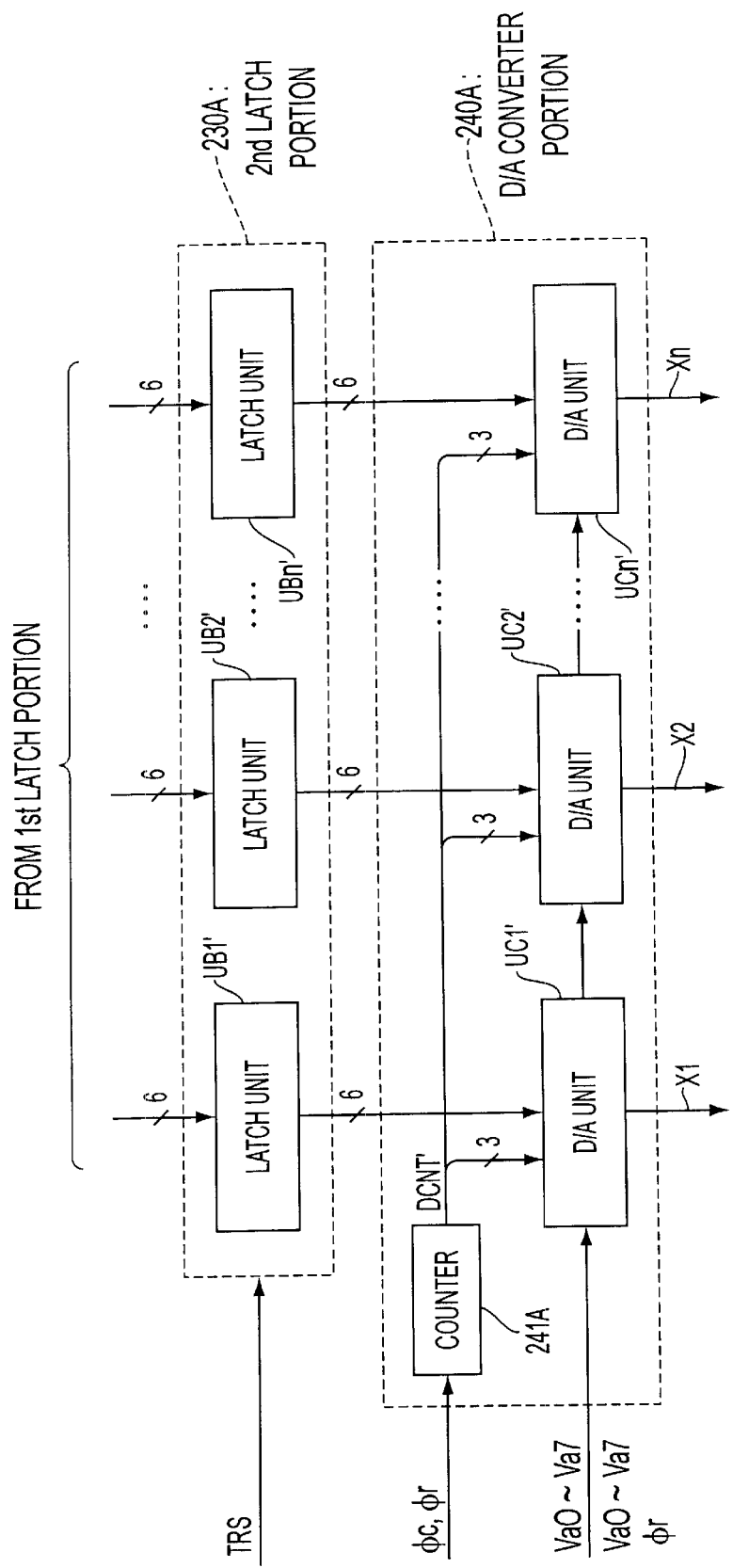
FIG. 18 is a block diagram illustrating the configuration of each of a second latch portion 230A and a DA converter 240A employed in a second embodiment of the present invention.

The signal line driving circuit of the second embodiment differs in the construction of the second latch portion 230 and the DA converter portion 240 from that of the signal line driving circuit 200 of the first embodiment illustrated in FIG. 2. FIG. 18 is a block diagram illustrating the configuration of each of a second latch portion 230A and a DA converter portion 240A used in the second embodiment.

As illustrated in this figure, the second latch portion 230A consists of n latch units UB1' to UBn'. Each of the latch units UB1' to UBn' consists of six D flip-flops, to which latch pulses TRS are supplied as clock pulses. Each of the latch units UB1' to UBn' latches 6-bit image data according to the latch pulses TRS. Each of the latch units UB1' to UBn' differs from the latch unit UB1 of the first embodiment of FIG. 8 in that each of the latch units UB1' to UBn' does not have selection circuits 231S to 235S, and that each of the latch units UB1' to UBn' is not supplied with the latch reset signal LRST.

Next, regarding the DA converter portion 240A, this portion has a counter 241A and DA units UC1' to UCn'. The counter 241A is a 3-bit up-counter and counts the number of leading-edges and trailing-edges of clock pulses φc. Moreover, the counter 241A is adapted so that the count value thereof is reset to "0" in response to a reset signal φr. Incidentally, the reset signal φr having a period of one horizontal period specifies a moment at which a reset voltage Vr is applied to the signal line 6a, as will be described later.

Incidentally, the counter 241A supplies the result of the count to the DA units Uc1' to UCn' as count data DCNT'. In other words, the counter 241A is a device that is common to the DA units Uc1' to UCn'.

On the other hand, the DA converter portion 240 of the first embodiment has a counter correspondingly to each of the DA units UC1 to UCn. Thus, the DA converter portion 240' of the second embodiment can reduce the number of counters to (1/n), in comparison with that of counters in the case of the DA converter portion 240 of the first embodiment.

Incidentally, in the following description, the first, second, and third bits of the count data DCNT' are designated by CN0, CN1, and CN2, respectively.

2-2. Configuration of DA Units

Figure 19:
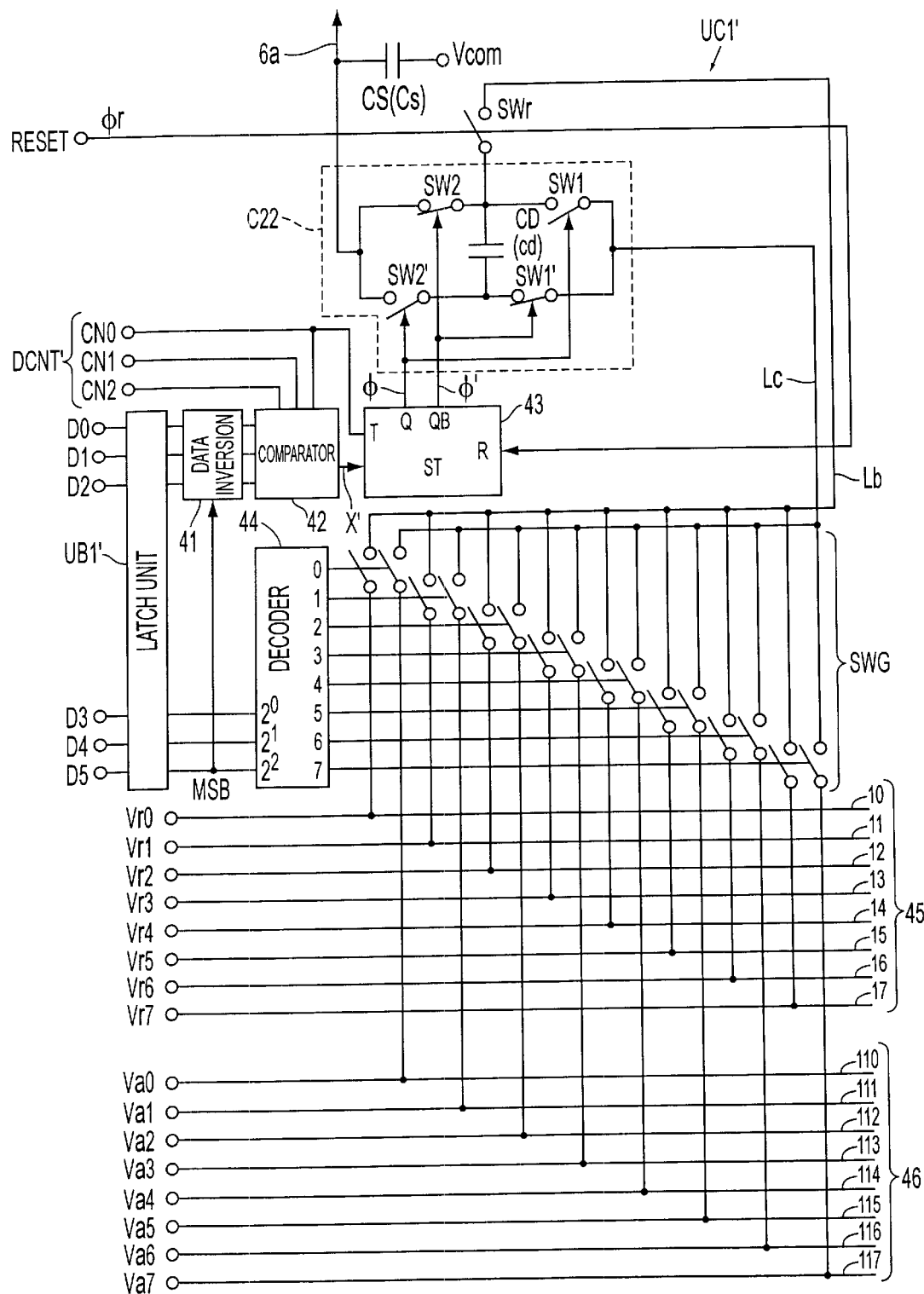
FIG. 19 is a block diagram illustrating a DA unit UC1' employed in the second embodiment and peripheral circuits thereof.

Next, the DA units UC1' to UCn' have the same configuration. Now, the configuration of the DA unit UC1' will be described hereinbelow. FIG. 19 is a circuit diagram illustrating the configuration of the DA unit UC1' and peripheral circuits thereof.

The DA unit UC1' has a data inversion circuit 41, a comparator 42, and a trigger type flip-flop 43, and a second charging portion C22.

The data inversion circuit 41 has three 2-input 1-output exclusive-OR circuits. Each of the exclusive-OR circuits calculates the exclusive-OR of data D0 to D2 respectively indicated by three low order bits and D5 indicated by the most significant bit MSB. Thus, when the data D5 indicated by the most significant bit MSB is "1", the data inversion circuit 41 inverts each of the data D0 to D2 respectively indicated by three low order bits and then outputs the inverted data. On the other hand, when the data D5 indicated by the most significant bit MSB is "0", the data inversion circuit 41 outputs the data D0 to D2 respectively indicated by three low order bits without inverting the data D0 to D2.

The comparator 42 compares each output signal of the inversion circuit 41 with the count data CN0 to CN2, and generates an output signal X', whose signal level is an H level when there is a match therebetween, and whose signal level is an L level when there is no match therebetween.

The trigger type flip-flop 43 has a trigger terminal T, a stop terminal ST, a non-inverting output terminal Q, and an inverting output terminal QB, and a reset terminal R. This trigger-type flip-flop 43 is configured so that when the level of the voltage of the stop terminal ST is an H level, the input of the trigger terminal T is disabled until the level of the voltage of the reset terminal R becomes an H level. Thus, in a time period between a moment at which the level of the voltage of the stop terminal ST changes from an L level to an H level and a moment at which the level of the voltage at the reset terminal R become an H level the level of the voltage at the non-inverting terminal Q is a logical level just before the level of the voltage at the stop terminal ST changes from an L level to an H level. Further, a reset signal φr is supplied to the reset terminal R. Furthermore, a signal CN0 representing the least significant bit of the count data DCNT' is supplied to the trigger terminal T.

Therefore, in a time period between a moment at which the level of the reset signal φr changes from an H level to an L level and a moment at which the signal level of the signal X' changes from an L level to an H level, the trigger type flip-flop 43 changes the voltages (namely, the clock signals φ and φ') at the non-inverting output terminal Q and the inverting output terminal QB according to the signal CN0.

Incidentally, the second charging portion C22 operates according to clock signals φ and φ'. Further, the reset signal φr resets the counter 241A, as described above. Therefore, the second charging portion C22 operates during a time period corresponding to a value indicated by 3 low order bits of image data. Incidentally, if the clock signals CK used in the first embodiment are employed as clock signals φc for the counter 241A, each of the switches SW1, SW2, SW1', and SW2' can operate at the same speed as in the case of the first embodiment.

Furthermore, the DA unit UC1' has a decoder 44 and a switch group SWG. The decoder 44 decodes the data D3, D4, and D5 indicated by three high order bits of the image data latched by the latch unit UB1'. The switch group SWG consists of 8 pairs of switches, as shown in this figure.

Each of input terminals of the switch group SWG is connected to a wire group 45 or 46. Further, each of output terminals of the switch group SWG is connected to a wire Lc or Lb. Incidentally, the wire group 45 has wires 10 to 17 to which 8 kinds of reset voltages Vr0, Vr1, . . . , Vr7 are respectively supplied. The wire group 46 has wires 110 to 117 to which 8 kinds of reference voltages Va0, Va1, . . . , Va7 are respectively supplied. Moreover, the switch group SWG selects one of 8 kinds of the reset voltages Vr0, Vr1, . . . Vr7 according to an output signal of the decoder 44, and then outputs the selected reset voltage to the wire Lc. Furthermore, the switch group SWG selects one of 8 kinds of the reference voltages Va0, Va1, . . . , Va7, and outputs the selected reference voltage to the wire Lb.

In other words, the decoder 44 and the switch group SWG have the function of selecting one of 8 kinds of sets of the reset voltage and the reference voltage (Vr0, Va0), (Vr1, Va1), . . . , (Vr7, Va7) according to the data D3 to D5 indicated by the three high order bits of the image data.

Figure 20:
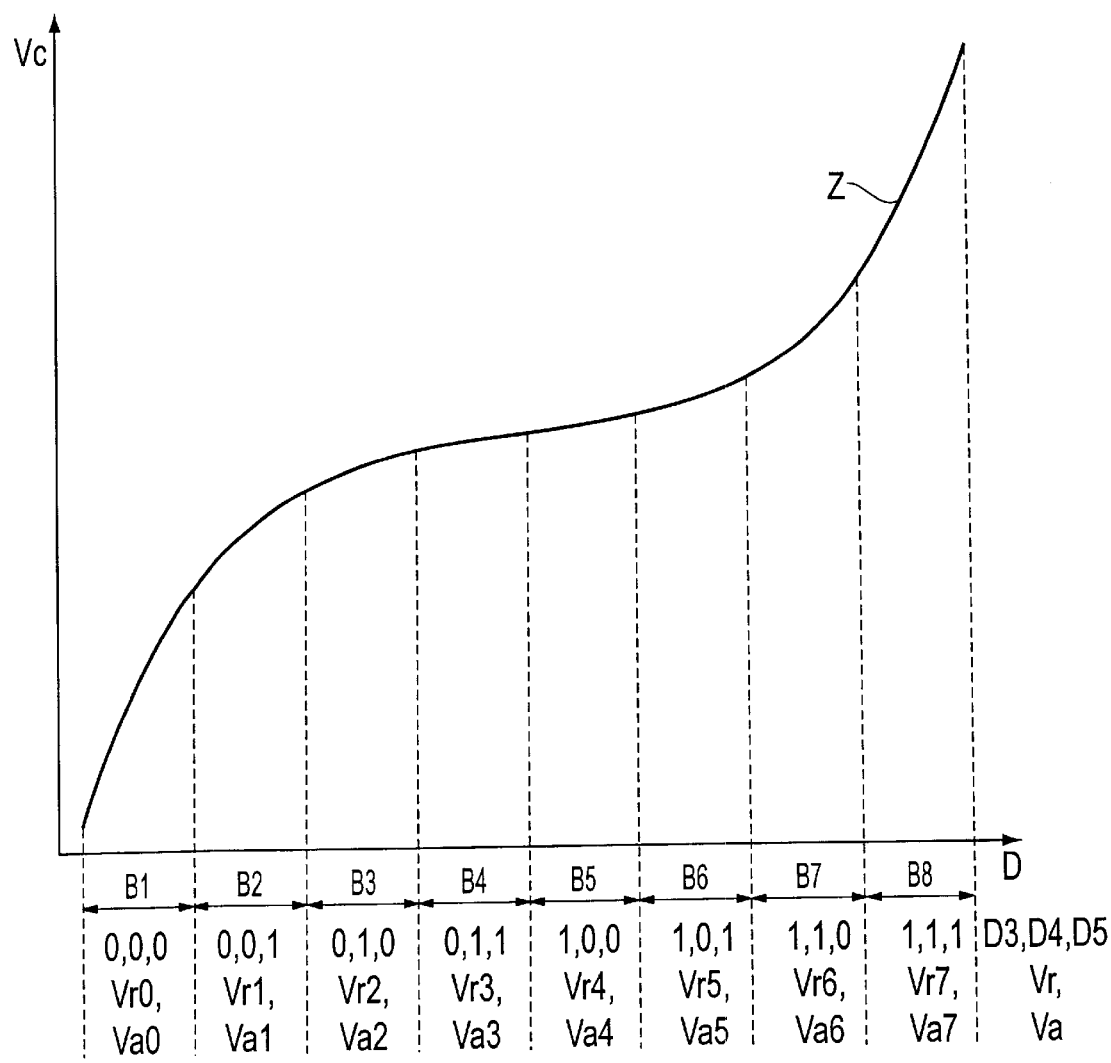
FIG. 20 is a graph illustrating the relation between a combination of a reset voltage Vr and a reference voltage Va and a γ correction characteristic curve.

The reason for preparing eight kinds of sets of the reset voltage Vr and the reference voltage Va is to bring the characteristic of a DA conversion close to the characteristic of an ideal γ correction. It is assumed that, for example, an output characteristic curve Z illustrated in FIG. 20 is a desired γ correction characteristic curve. This embodiment selects a set of the reset voltage Vr and the reference voltage Va according to the data D3, D4, and D5 indicated by the three high order bits of the image data D. Thus, as illustrated in FIG. 20, the γ correction characteristic can be obtained over eight divided regions B1 to B8. Consequently, the DA conversion characteristic of the DA unit UC1' can be brought close to the ideal characteristic.

Incidentally, the relationship between the reset voltage Vr and the reference voltage Va is set as follows. That is, Vr0<Va0, Vr1<Va1, Vr2<Va2, Vr3<Va3, Vr4>Va4, Vr5>Va5, Vr6>Va6, Vr7>Va7. Each of the sets (Vr0, Va0) to (Vr3, Va3) is selected when the data D5 indicated by the most significant bit MSB is "0". Each of the sets (Vr4, Va4) to (Vr7, Va7) is selected when the data D5 indicated by the most significant bit MSB is "1". That is, the voltages Vr0 to Vr7, and Va0 to Va7 are determined so that the relationship in value between the reset voltage Vr and the reference voltage Va may be reversed according to the data D5 indicated by the most significant bit MSB of the image data. The reason for determining the voltages Vr0 to Vr7, and Va0 to Va7 will be described hereinbelow.

As illustrated in FIG. 7(A), in a range A1, the curvature of the γ correction characteristic curve decreases with increase in the value indicated by the image data. Further, in another range A2, the curvature of the γ correction characteristic curve increases with increase in the value indicated by the image data. In the range A1, it is necessary for obtaining such a γ correction characteristic curve to set the reset voltage Vr in such a way as to be lower than the reference voltage Va (see FIG. 5). In the range A2, it is necessary to set the reset voltage Vr in such a manner as to be higher than the reference voltage Va (see FIG. 6). Which of the ranges A1 and A2 the value indicated by the image data belongs to is determined according to the data D5 indicated by the most significant bit MSB of the image data. Therefore, the voltages Vr0 to Vr7 and Va0 to Va7 are determined so that when the data D5 is "0", Vr<Va, and that when the data D5 is "1", Vr>Va.

2-3. Operation of DA Unit

Figure 21:
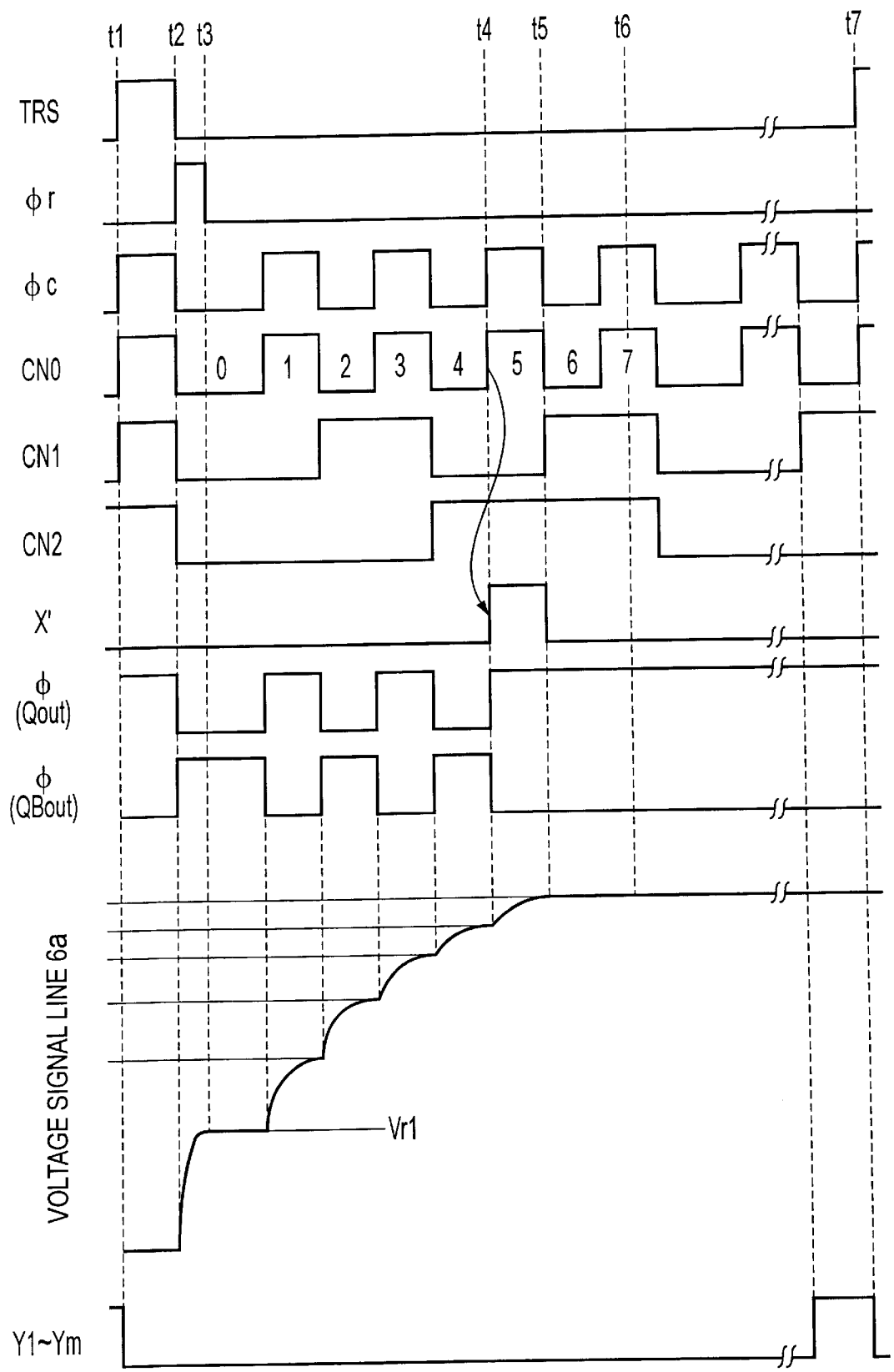
FIG. 21 is a timing chart illustrating an operation of the DA unit UC1' in the case that the image data D is "001101"

Next, an operation of the DA unit UC1' will be described hereunder. In this embodiment, it is assumed that the image data D is "001101". FIG. 21 is a timing chart illustrating an operation of the DA unit UC1' in the case that the image data D is "001101". In this example, D3=0, D4=0, and D5=1. Thus, the voltages Vr1 and Va1 are respectively selected as the reset voltage and the reference voltage correspondingly to the switch group SWG.

First, when the signal level of the latch pulse TRS changes from an L level to an H level at the moment t1, the latch unit UC1' latches image data at a moment at which the signal level of the latch pulse TRS rises. The data D5 indicated by the most significant bit MSB of the image data is "0". Thus, the inversion circuit 41 transfer the data to the comparator 42 without inverting the three low order bits "101".

Next, when the signal level of the reset signal φr changes from an L level to an H level at the moment t2, the switch SWr is turned on. Thus, when the reset voltage Vr1 is applied to the signal line 6a, the reset voltage Vr1 is charged into the parasitic capacitance CS. Consequently, the signal level of the voltage of the signal line 6a rises at the moment t2 and becomes flat after reaching the reset voltage Vr1.

Further, the counter 241A and the trigger type flip-flop 43 are reset in synchronization with the leading edge (at the moment t2) of the reset signal φr. Moreover, when the signal level of the reset signal φr changes from an H level to an L level at time t3, the counter 241A starts counting by setting a count value "0" as an initial value. Furthermore, the clock signals φ and the inverted clock signals φ' become active. In this example, the data indicated by the three low order bits of the image data is "5" (namely, "101"). Thus, when the data indicated by the three low order bits of the count data DCNT' is "5", the signal level of the output signal X' of the comparator 42 is changed from an L level to an H level.

Therefore, at the moment t4 at which the counter 241A counts five edges of the clock signal bc, the signal level of the output signal X' changes from an L level to an H level. The trigger type flip-flop 43 operates in a time period between a moment at which the reset signal φr becomes active and a moment at which the output signal X' thereof becomes active. Thus, in a time period between the moments t3 and t4, which correspond to the value indicated by the three low order bits of the image data, the clock signal φ and the inverted clock signal φ' become active. Namely, the second charging portion C22 operates in a time period corresponding to a value indicated by the three low order bits of the image data. Consequently, the charging and discharging of the internal capacitance CD are performed a number of times, which corresponds to the value indicated by the three low order bits of the image data. Therefore, the voltage of the signal line 6a rises stagewise to a desired voltage from the reset voltage Vr1, as illustrated in the figure.

Further, from the moment t5 on, the signal level of the clock signal φ is fixed at an H level until the signal level of the reset signal φr becomes an H level again. On the other hand, the signal level of the inverted clock signal φ' is fixed at an L level. Incidentally, the period of the reset signal φr is one horizontal scanning period. Therefore, the second charging portion C22 stops charging and discharging operations until the reset signal φr becomes active in the next horizontal scanning period.

Additionally, in the case that the value indicated by the three low order bits of the image data is "7", charging of the parasitic capacitance CS is completed at the moment t6. The scanning line driving circuit 100 maintains the signal level of each of the scanning signals Y1 to Ym at an H level in a time period from the moment t6 to the moment t7 at which the signal level of the latch pulse TRS becomes an H level next. For instance, as illustrated in FIG. 21, the signal level of each of the scanning signals Y1 to Ym becomes an H level immediately before the latch pulse TRS becomes active. Consequently, the voltage of the signal line 6a is applied to the liquid crystal of each of the pixels.

Figure 23:
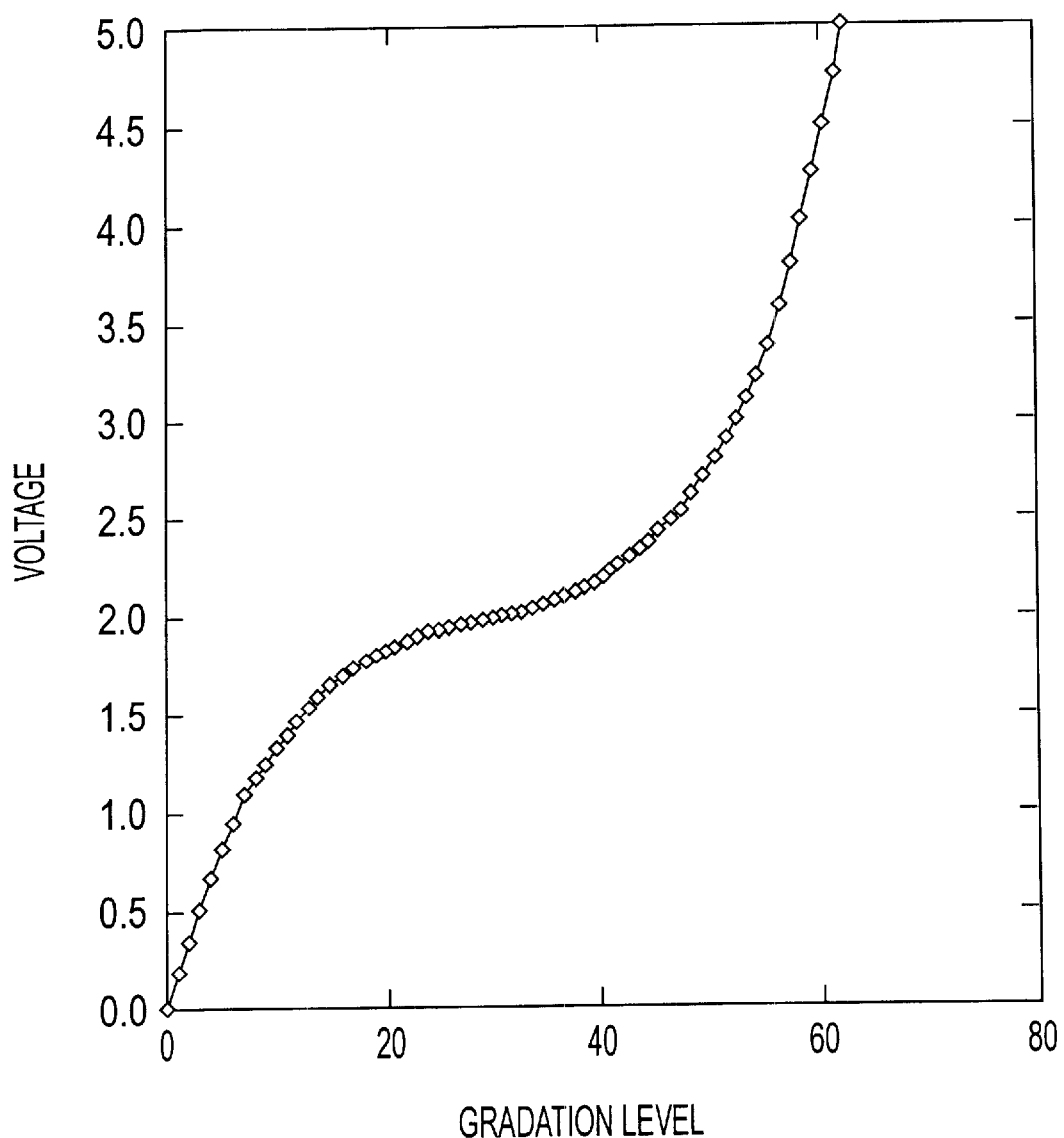
FIG. 23 is a graph illustrating an output voltage characteristic of the DA unit UC1' in the case that the reset voltages Vr0 to Vr7, and the reference voltages Va0 to Va7 are selected according to the table shown in FIG. 22.

In this DA unit UC1', the capacitance ratio a of the value of the internal capacitance Cd to the value of the parasitic capacitance Cs in the signal line 6a is set at, for example, 1/49. The reset voltages Vr0 to Vr7 and the reference voltages Va0 to Va7 are set according to the data D3, D4, and D5 respectively corresponding to the three high order bits of the image data, as illustrated in FIG. 22. In this case, such voltages can be supplied to the signal lines 6a according to the ideal γ correction curve, as illustrated in FIG. 23.

2-4. Operation of Signal Line Driving Circuit

Figure 24:
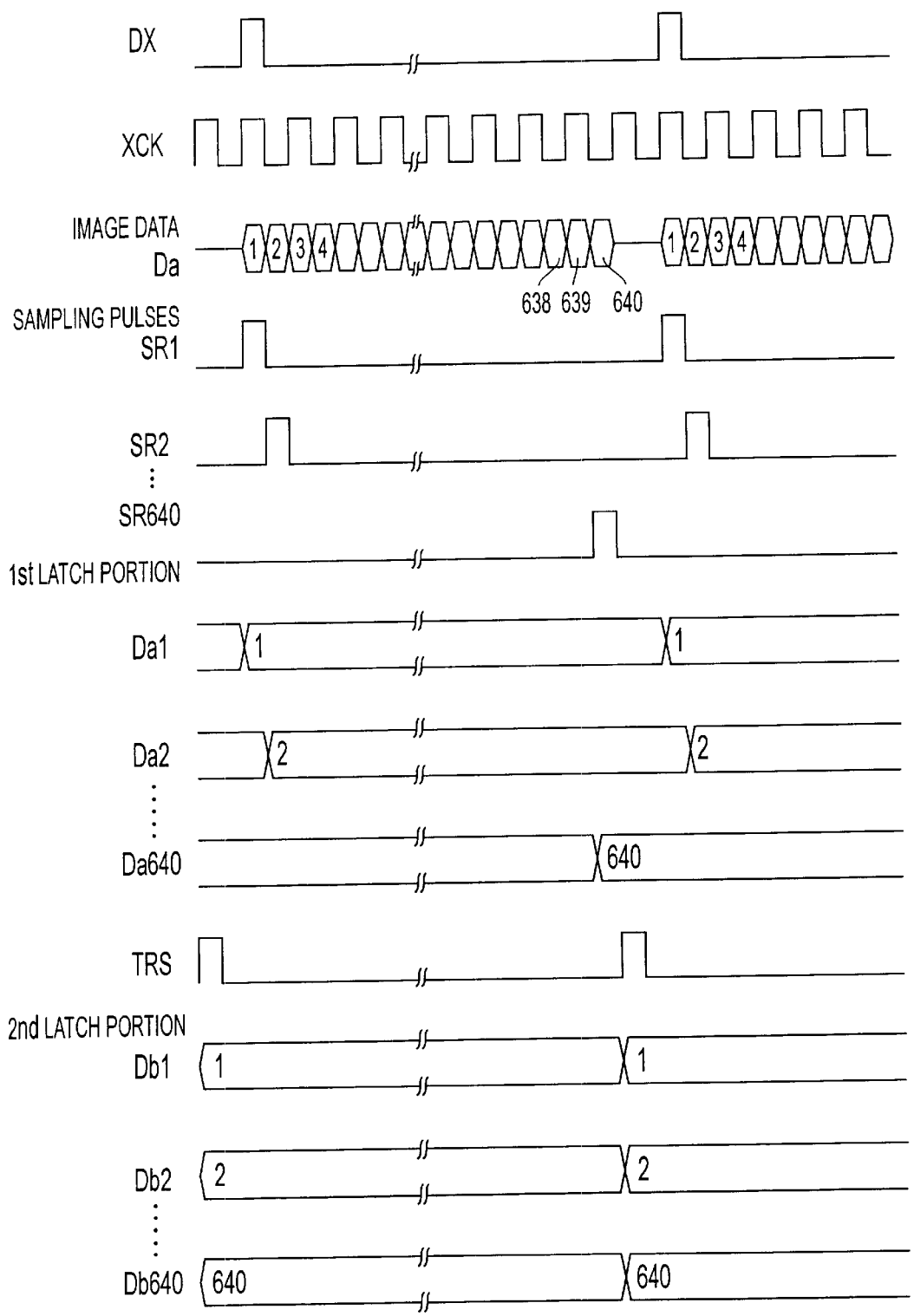
FIG. 24 is a timing chart illustrating an operation of a signal line driving circuit used in the second embodiment.

Next, an operation of the signal line driving circuit will be described hereinbelow. FIG. 24 is a timing chart illustrating an operation of the signal line driving circuit. Incidentally, it is assumed that the number of the signal lines 6a of the liquid crystal panel A is 640.

As shown in FIG. 24, when the signal level of an X transfer start pulse DX becomes an H level, the X shift register 210 generates sampling pulses SR1, SR2, . . . , SR640 by serially shifting the X transfer start pulse DX according to the X clock XCK. The image data D are latched by the first latch portion 220 sequentially in response to the sampling pulses SR1, SR2, . . . , SR640. As a result, the latch units UA1 to UA640 of the first latch portion 220 output the image data Da1 to Da640 illustrated in FIG. 24.

Next, when the signal level of the latch unit TRS changes from an L level to an H level, the latch units UB1' to UB640' of the second latch portion 230' latch the image data Da1 to Da640 simultaneously. As a result, the latch units UB1' to UB640' outputs the image data Db1 to Db640 illustrated in FIG. 24. The DA converter portion 240A first charges the reset voltage Vr, which corresponds to the value indicated by the three high order bits of the image data, into the parasitic capacitance CS of the signal line 6a according to the image data Db1 to Db640 obtained in this manner. Subsequently, the DA converter portion 240A repeats the charging and discharging between the internal capacitance CD and the parasitic capacitance CS a number of times corresponding to a value indicated by the low order bits of the data. Consequently, the voltage corresponding to the value indicated by the image data is applied to the signal line 6a.

Incidentally, in the foregoing description of the second embodiment, the case of processing the 6-bit image data has been described. However, the present invention is not limited thereto. Needless to say, various kinds of image data, such as 4-bit image data, 5-bit image data, 7-bit image data, may be processed.

Furthermore, when the value indicated by the most significant bit MSB of the image data D is "1", the first to third bits thereof are reversed. This is because the liquid crystal panel A is adapted to be used in a normally white mode. Thus, if the liquid crystal panel A is adapted to be used in a normally black mode, the first to third bits thereof are reversed when the value indicated by the most significant bit of the image data is "0". Incidentally, this is the same with the first embodiment.

Furthermore, needless to say, in the liquid crystal display device according to the second embodiment, the second charging portion C2 or C21 described in the foregoing description of the first embodiment may be employed instead of the second charging portion C22.

Additionally, needless to say, the AC driving described in the description of the modification of the first embodiment may be employed in the liquid crystal display device according to the second embodiment.

Besides, although the liquid crystal display device according to the second embodiment selects and uses one of sets of the reference voltage Va and the reset voltage Vr, each of the reference voltages Va0 to Va7, and the reset voltages Vr0 to Vr7 may be generated by the variable constant voltage circuit. In this case, the γ correction characteristic can be adjusted. Thus, after the liquid crystal panel AA is manufactured, the influence of the γ correction characteristic may be included in the transmittance characteristics.

3. Examples of Application

Next, the liquid crystal display device described in the foregoing description of each of the first and second embodiments will be described hereinbelow.

Figure 25:
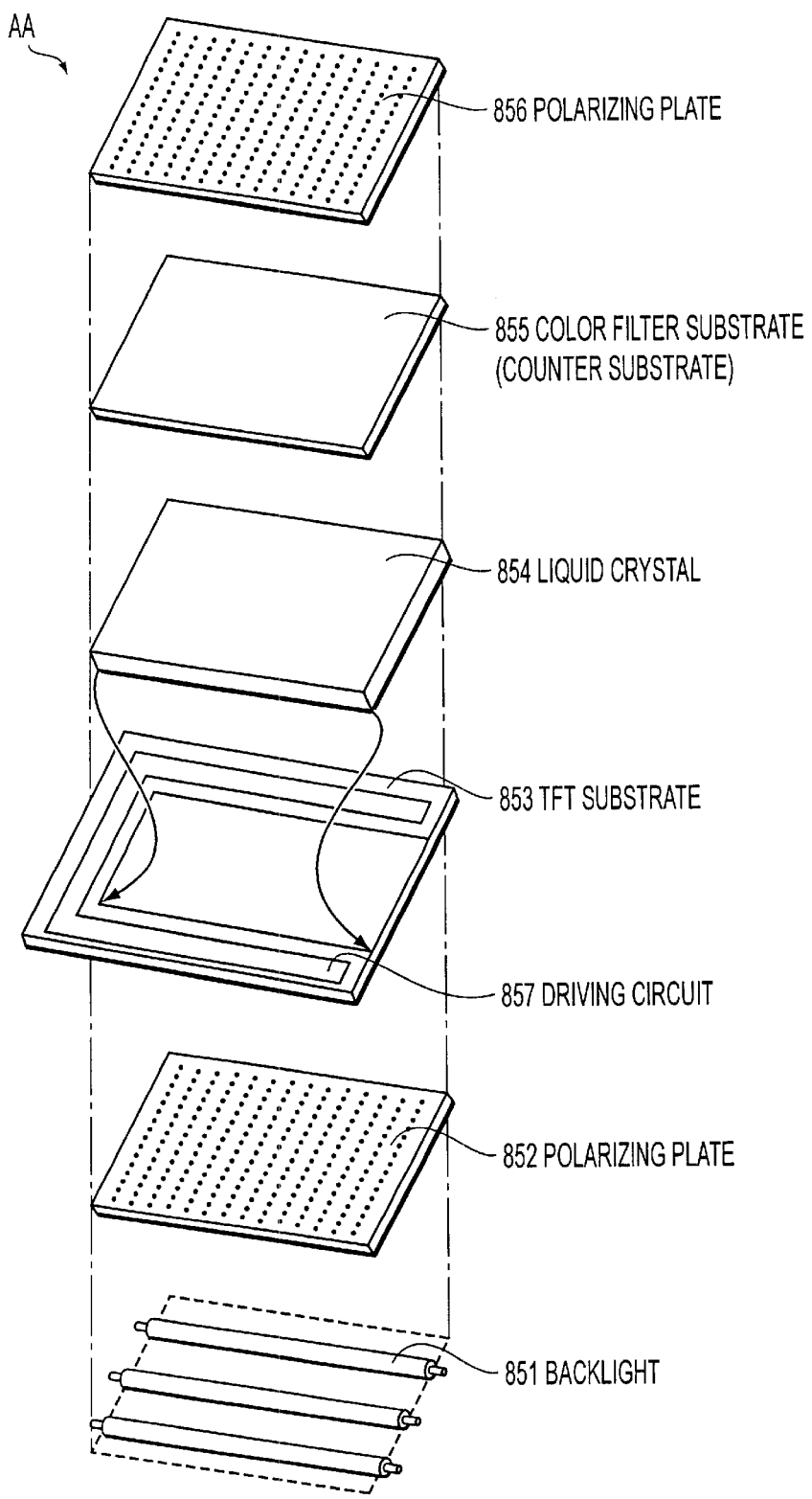
FIG. 25 is an exploded perspective diagram illustrating a liquid crystal panel AA.

FIG. 25 illustrates the practical configuration of the aforementioned liquid crystal panel AA. As illustrated in FIG. 25, the liquid crystal panel AA consists of a backlight 851, a polarizing plate 852, a substrate for the liquid crystal panel (namely, a TFT substrate) 853, a liquid crystal 854, a counter substrate 855 having an opposing electrode and a color filter, and a polarizing plate 856, which are stacked in this order.

An image display region A and a driving circuit 857 are formed on the substrate for the liquid crystal panel (namely, the TFT substrate) 853. This driving circuit 857 consists of the aforementioned scanning line driving circuit 100 and the signal line driving circuit 200.

Figure 26:
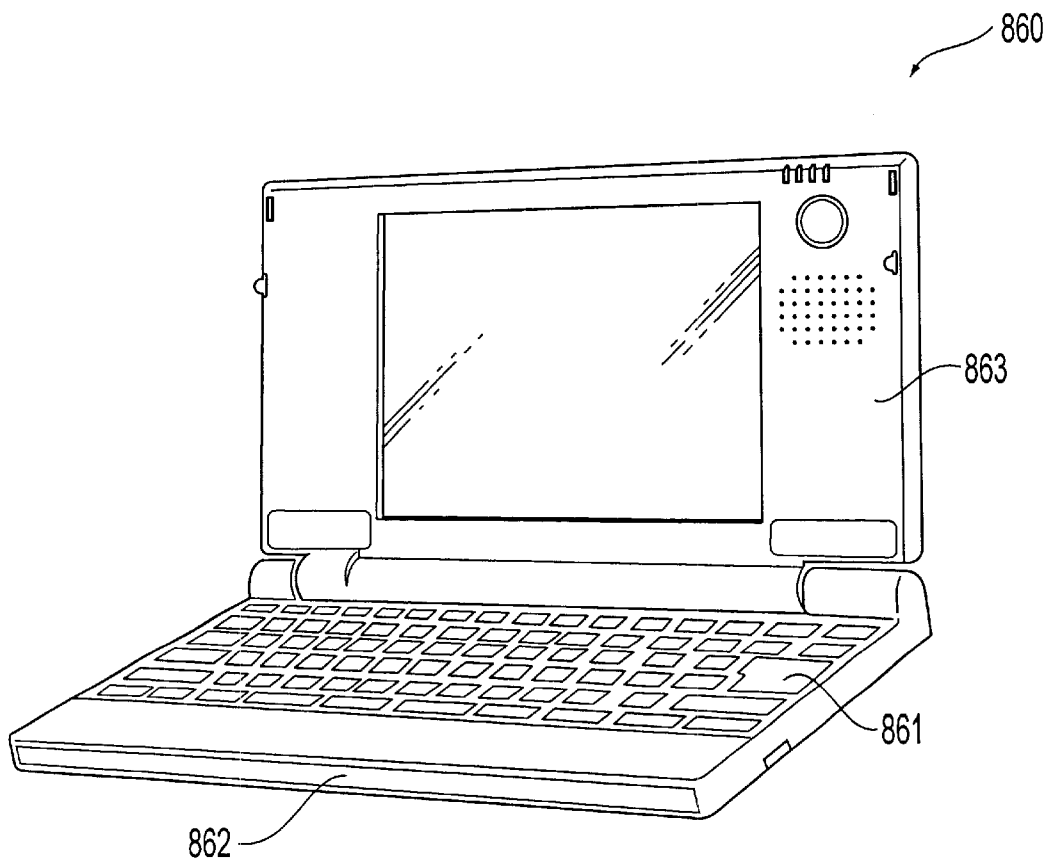
FIG. 26 is a perspective diagram illustrating a portable computer to which a liquid crystal display is applied.

Next, an example of application of the liquid crystal display device to a portable computer is described hereunder. As illustrated in FIG. 26, the portable computer 860 has a main unit portion 862 provided with a keyboard 861, and also has a liquid crystal display screen 863. This liquid crystal display screen corresponds to the image display region A of the aforementioned liquid crystal panel AA.

Figure 27:
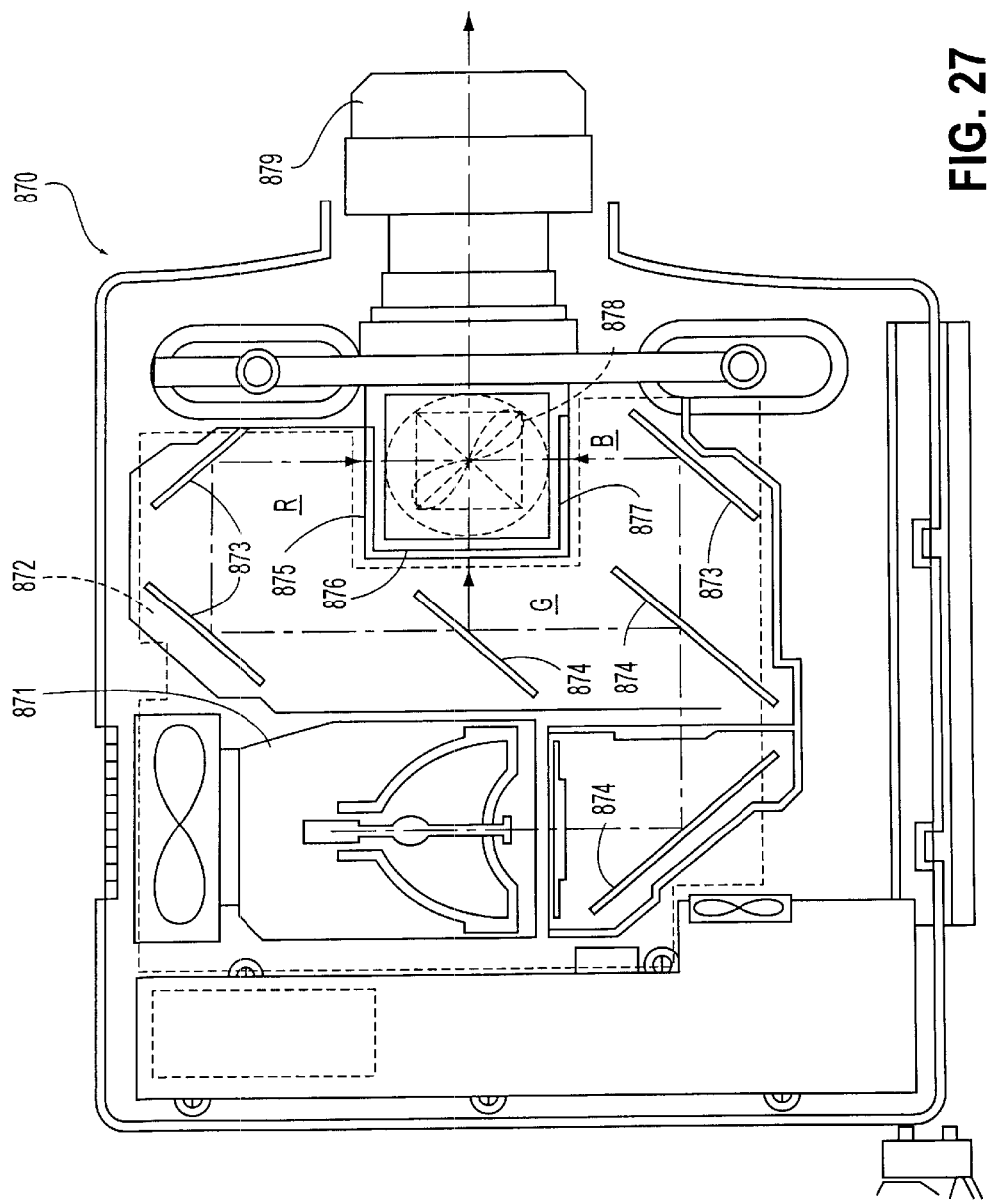
FIG. 27 is a perspective diagram illustrating a video projector to which a liquid crystal display device is applied.
Figure 28:
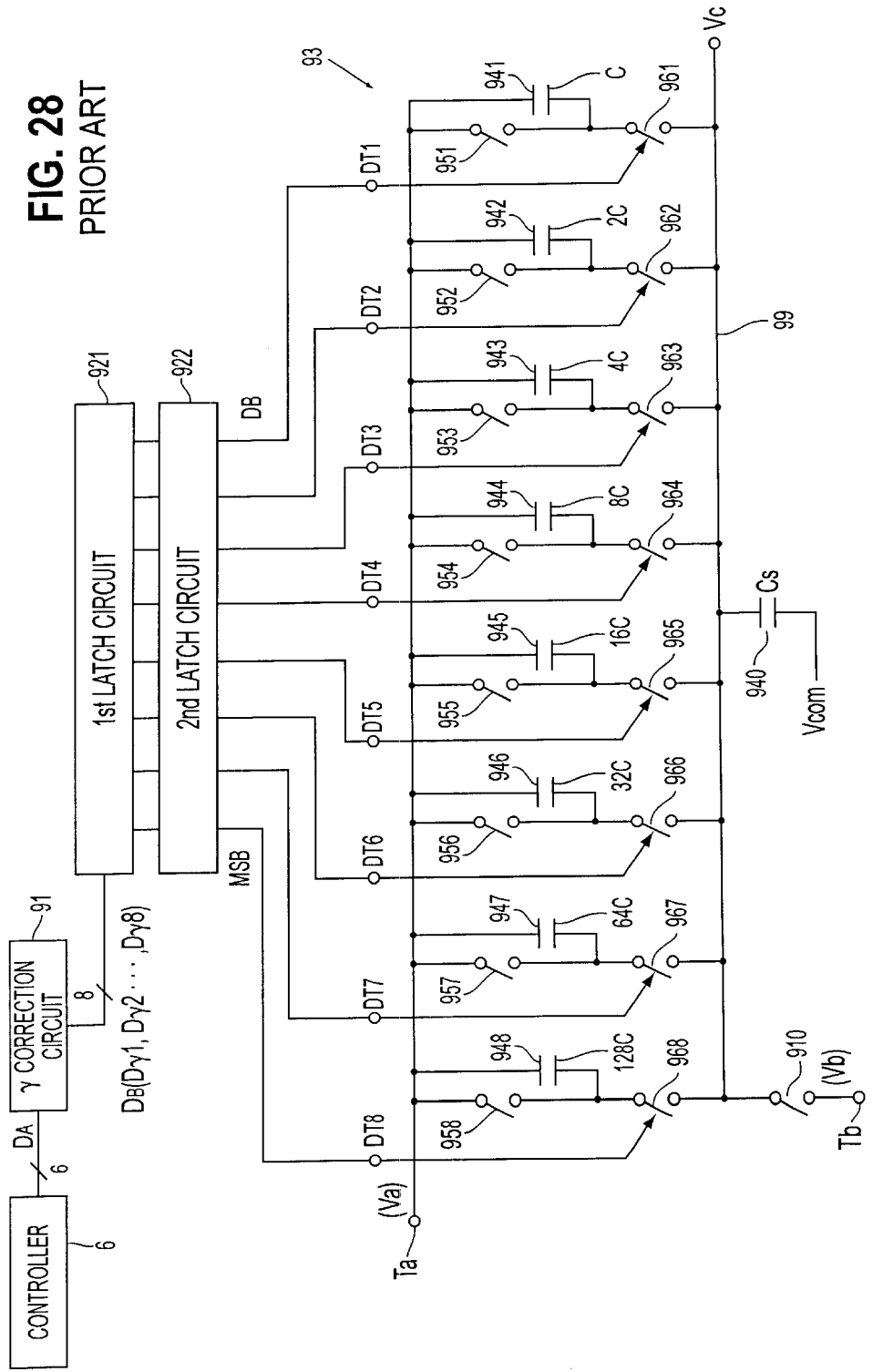
FIG. 28 is a block diagram illustrating a signal line driving circuit for driving a signal line, and peripheral circuits thereof.
Figure 29:
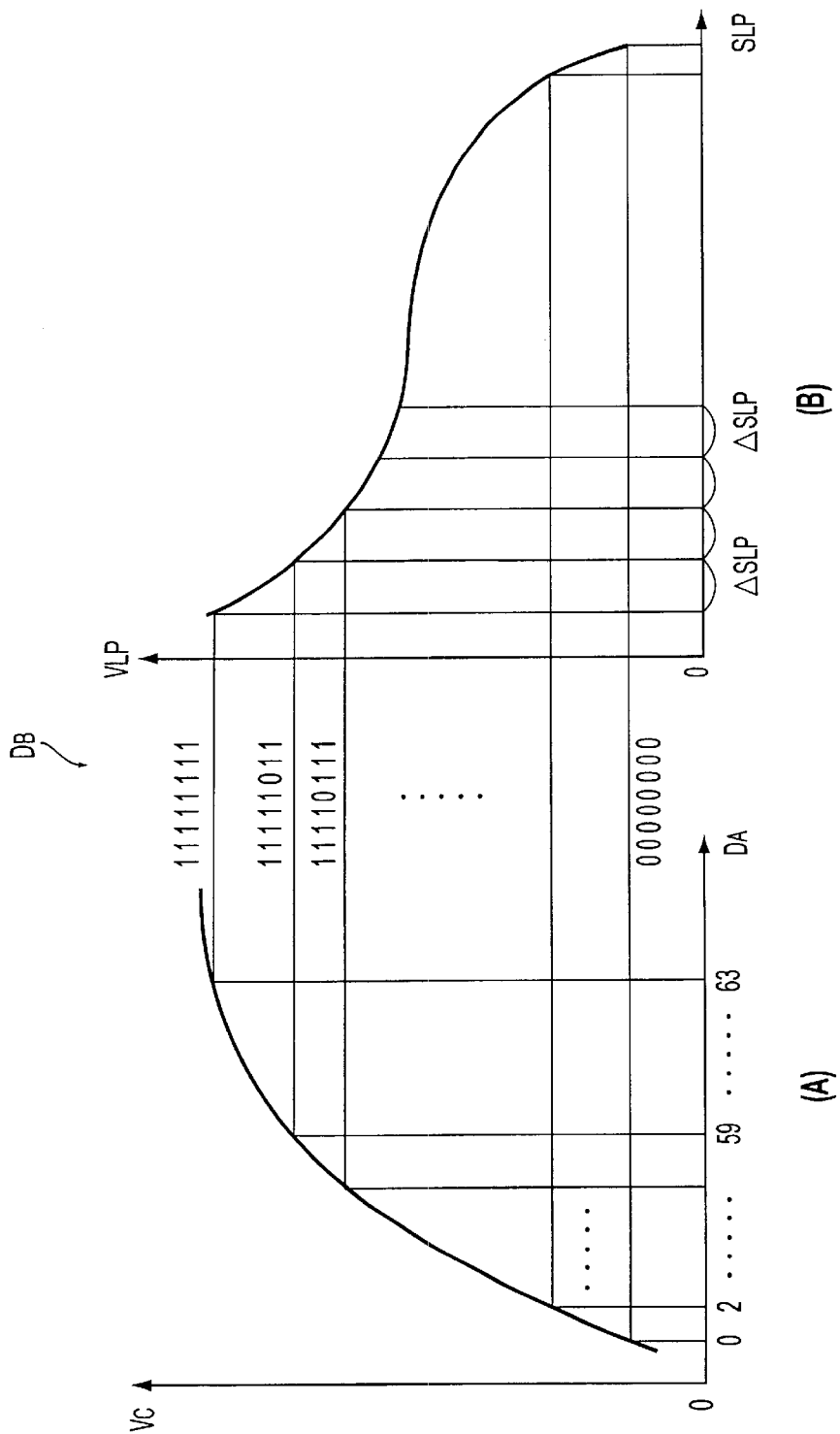
FIG. 29(A) is a graph illustrating the relation between the decimal value of the image data DA and the output voltage Vc of a DA converter 93.
FIG. 29(B) is a graph illustrating the relation between the transmittance SLP of a liquid crystal and the voltage VLP to be applied to a pixel electrode through a signal line.

Next, an example of application of the liquid crystal display device to a video projector is described hereinbelow. As illustrated in FIG. 27, the video projector 870 is a projection type projector employing a transmission type liquid crystal panel as a light valve. This video projector 870 employs, for example, a triple prism type optical system. In the video projector 870 shown in FIG. 27, projection light irradiated from a white-light lamp unit 871 is separated into three primaries, namely, R, G, B light rays by a plurality of mirrors 873 and two dichroic prisms 874 in a light guide 872. The separated light rays are led to three liquid crystal panels 875, 876, 877 respectively displaying images in such colors. Then, the light rays modulated by the liquid crystal panels 875, 876, 877 are incident upon a dichroic prism 878 from three directions. The dichroic prism 878 deflects the R (red) light ray and the B (blue) light ray by 90 degrees. On the other hand, the G (green) light ray travels rectilinearly. Thus, a color image is synthesized from component images displayed in such colors. Then, the color image is projected on the screen through a projection lens 879.

In addition, examples of the electronic equipment to which the present invention can be applied are an engineering workstation, a pager, a hand-portable telephone set, a word processor, a television set, a viewfinder type or direct-view-type camcorder, an electronic notepad, an electric calculator, a car navigation device, a POS terminal, and various devices each having a touch panel.

4. Primary Effects of Embodiments

As described above, the embodiments have effects in that the DA converter portions 240 and 240A can obtain voltages to be applied to pixels corresponding to image data, and that the DA converter portions 240 and 240A itself have the γ correction functions.

The embodiments have effects in that it is sufficient to provide only one internal capacitance CD in each of the DA units UC1 and UC1', and thus the area occupied by and the power consumption of the circuit of the DA unit is reduced, as compared with those of the case of employing the multi-bit DA converter or the DA converter using operational amplifiers.

Furthermore, the liquid crystal panel AA usually employs a glass substrate as the device substrate. In this case, TFTs are used as active devices formed on the glass substrate. However, variation in the characteristics of TFTs is easily caused. Moreover, the withstand voltages of TFTs are low. In the case of the device of the present invention, TFTs are used only as various kinds of switches. Thus, the present invention have effects in that a stable output voltage characteristic can be obtained, that additionally, especially, the DA unit UC1' employs the second charging portion C22, and thus, the reset voltage Vr and the reference voltage Va can be set at low values, and that consequently, a desired γ correction characteristic can be obtained even when a TFT is used in the DA unit UC1'.

I claim:

1. A driving method for driving an electro-optical device having a plurality of scanning lines, a plurality of signal lines, a plurality of transistors connected to the scanning lines and the signal lines, and a plurality of pixel electrodes connected to the transistors, said driving method comprising:

charging a reset voltage into a parasitic capacitance of a signal line;

charging a reference voltage into an internal capacitance; and transferring charges between said internal capacitance and said parasitic capacitance, charging a reference voltage into said internal capacitance and transferring the charges being repeated a number of times determined according to a value indicated by image data.

2. The driving method for driving an electro-optical device according to claim 1, said transistors being turned on after charging a reference voltage into said internal capacitance and transferring the charges the number of times corresponding to the value indicated by the image data.

3. A driving method for driving an electro-optical device having a plurality of scanning lines, a plurality of signal lines, a plurality of transistors connected to the scanning lines and the signal lines, and a plurality of pixel electrodes connected to said transistors, said driving method comprising:

(a) selecting a reset voltage from a predetermined first reset voltage and a predetermined second reset voltage according to a most significant bit of image data, and supplying the selected reset voltage to a signal line;

(b) selecting a reference voltage from a first reference voltage and a second reference voltage according to the most significant bit of the image data, and supplying the selected reference voltage to an internal capacitance; and (c) transferring charges between said internal capacitance and a parasitic capacitance, selecting the reference voltage and transferring the charges being repeated a number of times corresponding to a value indicated by low order bits of the image data, which are other than the most significant bit of the image data.

4. A driving method for driving an electro-optical device having a plurality of scanning lines, a plurality of signal lines, a plurality of transistors connected to said scanning lines and said signal lines, and a plurality of pixel electrodes connected to said transistors, said driving method comprising:

(a) selecting a reset voltage from a predetermined first reset voltage and a predetermined second reset voltage according to a plurality of high order bits of image, and supplying the selected reset voltage to a signal line;

(b) selecting a reference voltage from a first reference voltage and a second reference voltage according to a most significant bit of the image data, and supplying the selected reference voltage to an internal capacitance; and (c) transferring charges between said internal capacitance and a parasitic capacitance, selecting the reference voltage and transferring the charges being repeated a number of times corresponding to a value indicated by low order bits of the image data other than the plurality of high order bits of the image data.

5. A DA converter provided in a driving circuit for driving an electro-optical device having a plurality of scanning lines, a plurality of signal lines, a plurality of transistors connected to said scanning lines and said signal lines, and a plurality of pixel electrodes connected to said transistors, said DA converter having a plurality of DA units respectively connected to the plurality of signal lines, each of said DA units comprising:

a first charging portion that charges a reset voltage into a parasitic capacitance of a signal line;

a second charging portion, provided with an internal capacitance, that charges a reference voltage into said internal capacitance, and that transfers charges between said internal capacitance and said parasitic capacitance after the reference voltage is charged into said internal capacitance; and a control portion that controls said first charging portion to charge said reset voltage into said parasitic capacitance, and that controls said second charging portion to repeat charging and transferring of charges a number of times corresponding to a value indicated by predetermined low order bits of the image data.

6. The DA converter according to claim 5, said control portion comprising:

a counter that counts said number of times for charging and transferring of charges;

a comparator that compares a count value of said counter with the value indicated by the low order bits of the image data; and a control signal generating circuit that generates a control signal used for controlling said second charging portion to perform the charging and the transferring of charges, according to a comparison result.

7. The DA converter according to claim 5, further comprising a counter that counts the number of times for charging and transferring of charges and that outputs count data representing a count value, said control portion of each of the DA units comprising:

a comparator that compares said count data with a value represented by said low order bits; and a control signal generating circuit that generates a control signal used to control said second charging portion in to cause the charging and the transferring of charges according to a comparison result.

8. The DA converter according to claim 5, further comprising:

a first selection circuit that selects a reset voltage from a first reset voltage and a second reset voltage according to a most significant bit of said image data and that supplies the selected reset voltage to said first charging portion as said reset voltage; and a second selection circuit that selects a reference voltage from a first reference voltage and a second reference voltage according to the most significant bit of said image data and that supplies the selected reference voltage to said second charging portion as said reference voltage charged into said internal capacitance.

9. The DA converter according to claim 8, said first charging portion comprising a first switch connected between said first selection circuit and said signal line, said second charging portion comprising a second switch connected between said second selection circuit and said internal capacitance and a third switch connected between said internal capacitance and said signal line, and said control portion turning on said first switch, turning off said first switch, and subsequently, said control portion alternately turning on and off said second switch and said third switch a number of times corresponding to a value indicated by the low order bits other than the most significant bit of the image data.

10. The DA converter according to claim 8, said first charging portion comprising a first switch connected between said first selection circuit and said signal line, said second charging portion comprising a second switch connected between said second selection circuit and a first terminal of a first internal capacitance, a third switch connected between said second selection circuit and a second terminal of said first internal capacitance, a fourth switch connected between said signal line and a first terminal of a second internal capacitance, and a fifth switch connected between said signal line and a second terminal of said second internal capacitance, and said control portion turning on said first switch, turning off said first switch, and subsequently, said control portion alternately turning on and off a pair of said second switch and said fifth switch and a pair of said third switch and said fourth switch a number of times corresponding to a value indicated by the low order bits other than the most significant bit of the image data.

11. The DA converter according to claim 5, further comprising a selection circuit that selects one of a plurality of sets of a reset voltage and a reference voltage according to a plurality of high order bits of the image data, that outputs the selected reset voltage from a reset voltage output terminal to thereby supply the selected reset voltage to said second charging portion, and that outputs the selected reference voltage from a reference voltage output to thereby supply the selected reference voltage to said second charging portion.

12. The DA converter according to claim 11, said first charging portion comprising a first switch connected between said reset voltage output terminal and said signal line, said second charging portion comprising a second switch connected between said reference voltage output terminal and said internal capacitance, and a third switch connected between said internal capacitance and said signal line, and said control portion turning on said first switch and turning off said first switch, and subsequently, said control portion alternately turning on and off said second switch and said third switch a number of times corresponding to a value indicated by the low order bits other than said plurality of high order bits of said image data.

13. The DA converter according to claim 11, said first charging portion comprising a first switch connected between said reset voltage output terminal and said signal line, said second charging portion comprising a second switch connected between said reference voltage output terminal and a first terminal of a first internal capacitance, a third switch connected between said reference voltage output terminal and a second terminal of said first internal capacitance, a fourth switch connected between said signal line and a first terminal of a second internal capacitance, and a fifth switch connected between said signal line and a second terminal of said second internal capacitance, said control portion turning on said first switch and turning off said first switch, and subsequently, said control portion alternately turning on and off a pair of said second switch and said fifth switch and a pair of said third switch and said fourth switch a number of times corresponding to a value indicated by the low order bits other than the plurality of high order bits of the image data.

14. A signal driving circuit comprising said DA converter according to claim 5, further comprising:

a shift register that sequentially generates selection pulses respectively corresponding to signal lines by sequentially shifting a start pulse;

a first latch portion that outputs image data respectively corresponding to the signal lines by sequentially latching the image data according to said selection pulses; and a second latch portion that latches the image data outputted from said first latch portion according to a latch pulse of one horizontal scanning period and that outputs the latched image data to said DA converter.

15. A driving circuit provided in an electro-optical device, comprising:

said signal line driving circuit according to claim 14; and a scanning line driving circuit that supplies scanning signals to said scanning lines, respectively, after a moment at which an operation of said second charging portion is terminated, when the value indicated by the low order bits is a maximum value.

16. An electro-optical panel comprising a device substrate, an opposing substrate having an opposing electrode, and a liquid crystal filled in a gap between said device substrate and said opposing electrode, said electro-optical panel further comprising:

said driving circuit according to claim 15;

a plurality of signal lines;

a plurality of scanning lines;

transistors connected to said plurality of signal lines and to said plurality of scanning lines; and pixel electrodes connected to said transistors.

17. The electro-optical panel according to claim 16, said transistors and transistors of said driving circuit being thin film transistors.

18. A projection display device comprising:

said electro-optical panel according to claim 16;

a light source that irradiates said electro-optical panel with light; and a projection optical mechanism that enlargedly projects light having passed through said electro-optical panel.

19. Electronic equipment comprising:

said electro-optical panel according to claim 16, an image being displayed on said electro-optical panel.

* * * * *

UNITED STATES PATENT AND TRADEMARK OFFICE
CERTIFICATE OF CORRECTION

PATENT NO. : 6,424,331 B1
DATED : July 23, 2002
INVENTOR(S) : Tokuro Ozawa

It is certified that error appears in the above-identified patent and that said Letters Patent is hereby corrected as shown below:

Title page,
Item [54], please amend the title to read:

-- DRIVING CIRCUIT FOR ELECTRO-OPTICAL DEVICE, DRIVING METHOD THEREFOR, DA CONVERTER, SIGNAL LINE DRIVING CIRCUIT, ELECTRO-OPTICAL PANEL, PROJECTION DISPLAY DEVICE, AND ELECTRONIC EQUIPMENT --

Item [22], please amend to read -- PCT Filed: October 15, 1999 --.

Signed and Sealed this

Twenty-fourth Day of December, 2002

JAMES E. ROGAN
*Director of the United States Patent and Trademark Office*